United States Patent
Ueno

(10) Patent No.: US 10,432,236 B2
(45) Date of Patent: Oct. 1, 2019

(54) FRONT-END MODULE

(71) Applicant: Murata Manufacturing Co., Ltd., Nagaokakyo-shi, Kyoto-fu (JP)

(72) Inventor: Koichi Ueno, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 14 days.

(21) Appl. No.: 15/857,686

(22) Filed: Dec. 29, 2017

(65) Prior Publication Data

US 2018/0123620 A1 May 3, 2018

Related U.S. Application Data

(63) Continuation of application No. PCT/JP2016/069667, filed on Jul. 1, 2016.

(30) Foreign Application Priority Data

Jul. 3, 2015 (JP) ................................. 2015-134748

(51) Int. Cl.
 *H04B 1/00* (2006.01)
 *H04B 1/48* (2006.01)
 (Continued)

(52) U.S. Cl.
 CPC ............. *H04B 1/0057* (2013.01); *H03H 7/38* (2013.01); *H03H 7/46* (2013.01); *H03H 11/344* (2013.01);
 (Continued)

(58) Field of Classification Search
 CPC .......... H04B 1/00; H04B 1/0057; H04B 1/18; H04B 1/44; H04B 1/48; H04B 1/525; H03H 11/344; H03H 7/38; H03H 7/46
 See application file for complete search history.

(56) References Cited

U.S. PATENT DOCUMENTS 9,455,686 B1 * 9/2016 Huang ................... H03H 11/04
2005/0020297 A1 1/2005 Axness et al.
(Continued)

FOREIGN PATENT DOCUMENTS

EP 1 289 159 A2 3/2003
JP 2003-078441 A 3/2003
(Continued)

OTHER PUBLICATIONS

Official Communication issued in International Patent Application No. PCT/JP2016/069667, dated Sep. 20, 2016.

*Primary Examiner* — Paul H Masur

(74) *Attorney, Agent, or Firm* — Keating & Bennett, LLP

(57) ABSTRACT

A front-end module, which uses a carrier aggregation method in which communication is performed by simultaneously using Band 8 and Band 3, includes an antenna switch module that switches connections between an antenna and a plurality of signal paths, a first circuit that is connected to a Band 8 signal path, and a second circuit that is connected to a Band 3 signal path and is electromagnetic-field coupled with the first circuit. A signal including a Band 3 frequency component that propagates from the signal path to the signal path via the antenna switch module and a signal including a Band 3 frequency component that propagates from the signal path to the signal path via the first circuit and the second circuit have a phase-shifted relationship with each other.

20 Claims, 10 Drawing Sheets

(51) Int. Cl.
- *H04B 1/18* (2006.01)
- *H03H 7/38* (2006.01)
- *H03H 7/46* (2006.01)
- *H04B 1/44* (2006.01)
- *H04B 1/525* (2015.01)
- *H03H 11/34* (2006.01)

(52) U.S. Cl.
CPC ............... *H04B 1/00* (2013.01); *H04B 1/18* (2013.01); *H04B 1/44* (2013.01); *H04B 1/48* (2013.01); *H04B 1/525* (2013.01)

(56) References Cited

U.S. PATENT DOCUMENTS

| | | | |
|---|---|---|---|
| 2007/0087704 A1* | 4/2007 | Gilberton | H03F 1/3241 455/114.3 |
| 2010/0157858 A1 | 6/2010 | Lee et al. | |
| 2011/0165848 A1* | 7/2011 | Gorbachov | H04B 1/0064 455/78 |
| 2013/0241666 A1* | 9/2013 | Granger-Jones | H01P 1/15 333/101 |
| 2014/0044022 A1* | 2/2014 | Matsuo | H04B 1/50 370/278 |
| 2014/0055209 A1 | 2/2014 | Ishizuka et al. | |
| 2014/0125428 A1 | 5/2014 | Iwaki | |
| 2015/0009980 A1* | 1/2015 | Modi | H03F 3/245 370/338 |
| 2015/0180423 A1* | 6/2015 | Sankaranarayanan | H03F 1/26 330/295 |
| 2015/0214995 A1* | 7/2015 | Kanemaru | H04B 1/0458 455/83 |
| 2015/0341076 A1* | 11/2015 | Uejima | H04B 1/0057 455/78 |
| 2015/0349724 A1* | 12/2015 | Wang | H03F 1/32 330/285 |
| 2016/0072456 A1* | 3/2016 | Lin | H03F 1/26 330/303 |
| 2017/0111078 A1* | 4/2017 | Onodera | H03H 9/64 |

FOREIGN PATENT DOCUMENTS

| | | |
|---|---|---|
| JP | 2007-049625 A | 2/2007 |
| JP | 2007-505591 A | 3/2007 |
| JP | 2012-514387 A | 6/2012 |
| JP | 2013-247605 A | 12/2013 |
| JP | 2014-096671 A | 5/2014 |
| WO | 2012/153654 A1 | 11/2012 |

\* cited by examiner

FRONT-END MODULE

CROSS REFERENCE TO RELATED APPLICATIONS

This application claims the benefit of priority to Japanese Patent Application No. 2015-134748 filed on Jul. 3, 2015 and is a Continuation Application of PCT Application No. PCT/JP2016/069667 filed on Jul. 1, 2016. The entire contents of each application are hereby incorporated herein by reference.

BACKGROUND OF THE INVENTION

1. Field of the Invention

The present invention relates to front-end modules that process high-frequency signals.

2. Description of the Related Art

In recent years, there has been a demand for a plurality of frequencies and a plurality of wireless methods (multiple bands and multiple modes) to be supported by a single cellular phone terminal. High-speed processing of a plurality of transmission and reception signals without incurring a reduction in quality is demanded in front-end modules that support multiple bands and multiple modes.

Japanese Unexamined Patent Application Publication No. 2014-96671 discloses a switching device and a module having improved isolation characteristics between two paths that are used for propagation of high-frequency signals. More specifically, a delay line is connected between two input/output terminals in a configuration in which one path is selected from among two paths as a signal propagation path, and as a result a signal that leaks from one path to the other path is canceled out.

However, the above-described switching device of the related art is always used in a system in which one signal path is selected from among two signal paths and then used for propagation of a signal.

In contrast, signals of a plurality of frequency bands are simultaneously made to propagate in a system in which a carrier aggregation (CA) method is used in which signals of different frequency bands are simultaneously made to propagate. The configuration of the switching device of the related art described above would not be adequate to secure isolation characteristics of a desired level between a plurality of signal paths used for propagation of signals of a plurality of frequency bands subjected to a CA operation.

SUMMARY OF THE INVENTION

Preferred embodiments of the present invention provide front-end modules that are able to secure excellent isolation characteristics between a plurality of frequency bands in a carrier aggregation method.

A preferred embodiment of the present invention provides a front-end module that uses a carrier aggregation method in which communication is performed by simultaneously using a first frequency band selected from among a plurality of frequency bands and a second frequency band selected from among the plurality of frequency bands and being at a different frequency from the first frequency band. The front-end module includes a plurality of signal paths that connect a transmission processing circuit, which amplifies transmission waves in advance, or a reception processing circuit, which subjects reception waves to signal processing, and an antenna element to each other, and that are used to propagate signals of corresponding frequency bands among the plurality of frequency bands; an antenna switch module that switches connections between the antenna element and the plurality of signal paths by simultaneously connecting the antenna element and at least two signal paths among the plurality of signal paths; a first circuit connected to a first signal path used to propagate signals of the first frequency band; and a second circuit that is connected to a second signal path used to propagate signals of the second frequency band, and is electromagnetic-field coupled with the first circuit. A signal including a frequency component of the second frequency band that propagates from the first signal path to the second signal path via the antenna switch module, and a signal including a frequency component of the second frequency band that propagates from the first signal path to the second signal path via the first circuit and the second circuit have a phase-shifted relationship with each other.

With this configuration, where signals of a first frequency band and a second frequency band are subjected to a CA operation, for example, a fundamental wave or harmonic component of the first frequency band that propagates from the first signal path to the second signal path via the antenna switch module and a fundamental wave or harmonic component of the first frequency band that propagates from the first signal path to the second signal path via the first circuit and the second circuit are phase-shifted with respect to each other, and therefore, cancel each other out. In addition, the amplitude and phase of the signal that propagates between the first signal path and the second signal path without passing through the antenna switch module are able to be easily adjusted by adjusting the degree of electromagnetic-field coupling between the first circuit and the second circuit. Therefore, excellent isolation characteristics are obtained between a plurality of frequency bands in the CA method.

In addition, the first frequency band may belong to a low-frequency band group, the second frequency band may belong to a high-frequency band group allocated to higher frequencies than the low-frequency band group, and a frequency of a harmonic of a signal of the first frequency band may be included in the second frequency band.

In a CA operation, a case is particularly assumed in which the frequency of a harmonic component of a transmission signal of a low-frequency band group is identical or substantially identical to the frequency of a reception band of a high-frequency band group. In this case, since the transmission signal and the reception signal are transmitted and received simultaneously, if the harmonic component propagates unaltered from the first signal path to the second signal path via the antenna switch module, the reception sensitivity in the high-frequency band group is significantly degraded.

With the above-described configuration, the amplitude and phase of the harmonic component are able to be easily adjusted by adjusting the degree of electromagnetic-field coupling. Therefore, degradation of reception sensitivity in the reception band of the high-frequency band group is reduced or prevented.

Furthermore, the first circuit may include a first inductance element, the second circuit may include a second inductance element that is electromagnetic-field coupled with the first inductance element, and the first inductance element and the second inductance element may both be chip inductors that are mounted on a module substrate in which the antenna switch module is provided.

With this configuration, the amplitude and phase of the signal that propagates from the first signal path to the second signal path without passing through the antenna switch module are able to be easily adjusted by adjusting the arrangement relationship of the chip inductors, which define the first circuit and the second circuit, on the module substrate. For example, the amplitude and phase of the signal are able to be easily adjusted by adjusting the distance between the two electromagnetic-field-coupled chip inductors.

Furthermore, the first circuit may include a first inductance element, the second circuit may include a second inductance element that is electromagnetic-field coupled with the first inductance element, one of the first inductance element and the second inductance element may be a chip inductor that is mounted on a module substrate in which the antenna switch module is provided, and the other one of the first inductance element and the second inductance element may be built into the module substrate.

With this configuration, since the other one of the inductor elements, which define the first circuit and the second circuit, is built into the inside of the module substrate, the number of circuit components mounted on the module substrate is reduced, and the degree of freedom of the arrangement layout of the other circuit components is improved. In addition, since the first inductance element and the second inductance element are able to be located close to each other in a direction orthogonal or substantially orthogonal to the module substrate, the degree of electromagnetic-field coupling therebetween is able to be increased. Furthermore, typically, a larger inductance value is able to be obtained with a chip inductor than with an inductor that is built into the inside of a substrate. Therefore, a chip inductor and a built-into-substrate inductor are able to be used as appropriate in accordance with the frequency bands when performing impedance matching.

Furthermore, the first circuit may include a first inductance element, the second circuit may include a second inductance element that is electromagnetic-field coupled with the first inductance element, and the first inductance element and the second inductance element may both be built into a module substrate that is equipped with the antenna switch module.

With this configuration, since both of the inductor elements that define the first circuit and the second circuit are built into the inside of the module substrate, the number of circuit components mounted on the module substrate is reduced, and the degree of freedom of the arrangement layout of the other circuit components is improved.

In addition, the front-end module may further include a phase-adjusting circuit that is connected to the first signal path or the second signal path and is able to adjust a phase of a high-frequency signal.

With this configuration, the phase of the signal that propagates from the first signal path to the second signal path without passing through the antenna switch module is able to be adjusted with greater accuracy over a wide range.

In addition, one of the first circuit and the second circuit may include an inductance element, and the other one of the first circuit and the second circuit may include a wiring line that is electromagnetic-field coupled with the inductance element.

With this configuration, a fundamental wave or harmonic component of the first frequency band that propagates from the first signal path to the second signal path via the first circuit and the second circuit is able to be generated through the electromagnetic-field coupling of the wiring line, as exemplified by a micro-strip line, and the inductance element. In addition, the amplitude and phase of the electromagnetic-field coupling signal are able to be changed by adjusting the coupling location of the wiring line and the inductor element.

Furthermore, the front-end module may perform communication by simultaneously using the first frequency band and the second frequency band from among the first frequency band, the second frequency band, and a third frequency band selected from among the plurality of frequency bands and being at a different frequency from the first frequency band and the second frequency band. A third signal path that is used to propagate signals of the third frequency band may branch, at a branching node, into a fourth signal path and a fifth signal path that are used to propagate signals of the third frequency band. The front-end module may further include a third circuit that is connected upstream of the branching node of the third signal path, a fourth circuit that is connected to the fourth signal path, and a fifth circuit that is connected to the fifth signal path. Two circuits from among the third circuit, the fourth circuit, and the fifth circuit may be electromagnetic-field coupled with each other. A signal including a frequency component of a fifth frequency band that propagates from the fourth signal path to the fifth signal path via the branching node, and a signal including a frequency component of the fifth frequency band that propagates from the fourth signal path to the fifth signal path via the two circuits may have a phase-shifted relationship with each other.

With this configuration, two circuits from among the third circuit, the fourth circuit, and the fifth circuit are electromagnetic-field coupled with each other between the fourth signal path and the fifth signal path, which branch from the third signal path, and therefore a signal including a frequency component of a fifth frequency band that propagates from the fourth signal path to the fifth signal path via the node and a signal including a frequency component of the fifth frequency band that propagates from the fourth signal path to the fifth signal path via the two circuits are able to cancel each other out.

Furthermore, the front-end module may perform communication by simultaneously using the first frequency band and the second frequency band, and a third frequency band selected from among the plurality of frequency bands and being at a different frequency from the first frequency band and the second frequency band. The antenna switch module may switch connections between the antenna element and the plurality of signal paths by simultaneously connecting the antenna element and three signal paths from among the plurality of signal paths. The front-end module may further include a third circuit that is connected to a third signal path that is used to propagate signals of the third frequency band; and a fourth circuit that is arranged downstream of a connection point between the first signal path and the first circuit or downstream of a connection point between the second signal path and the second circuit. Two circuits from among the first circuit or the second circuit, and the third circuit, and the fourth circuit may be electromagnetic-field coupled with each other. A signal including a frequency component of the second frequency band that propagates from the third signal path to the second signal path via the antenna switch module, and a signal including a frequency component of the second frequency band that propagates from the third signal path to the second signal path via the two circuits may have a phase-shifted relationship with each other.

With this configuration, not only is a signal including a frequency component of the second frequency band that propagates from the first signal path to the second signal path able to be reduced or prevented, but a signal including a frequency component of the second frequency band that propagates from the third signal path to the second signal path is also able to be reduced or prevented.

With front-end modules according to preferred embodiments of the present invention, excellent isolation characteristics are able to be obtained between a plurality of frequency bands in a carrier aggregation method.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
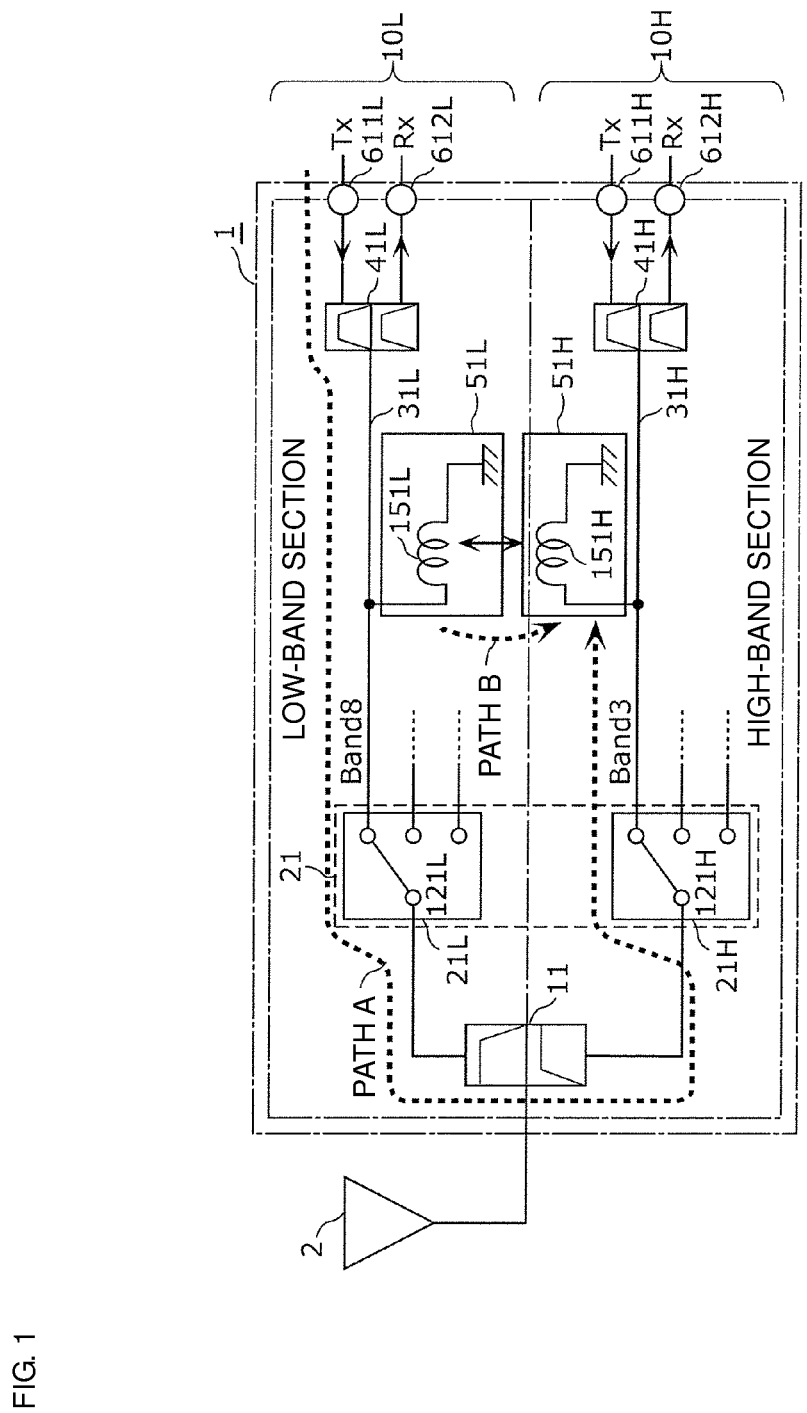
FIG. 1 is a circuit configuration diagram of a front-end module according to preferred embodiment 1 of the present invention.

Hereafter, preferred embodiments of the present invention will be described in detail with reference to the drawings. The preferred embodiments described hereafter each illustrate a comprehensive or specific example of the present invention. The numerical values, shapes, materials, elements, arrangement positions of the elements, the manners in which the elements are connected and so forth provided in the following preferred embodiments are merely examples and are not intended to limit the present invention. Elements not mentioned in the independent claim among elements in the following preferred embodiments are described as arbitrary elements. In addition, the sizes of or the size ratios between the elements illustrated in the drawings are not necessarily accurate.

Preferred Embodiment 1

FIG. 1 is a circuit configuration diagram of a front-end module 1 according to preferred embodiment 1. In the figure, the front-end module 1 according to preferred embodiment 1 and an antenna element 2 are illustrated. The front-end module 1 and the antenna element 2 are preferably provided in the front end of a cellular phone that supports multiple modes/multiple bands, for example.

The front-end module 1 includes a diplexer 11, an antenna switch module 21, a signal path 31H that is preferably used to propagate signals of Band 3 of the LTE standard (transmission band: 1710-1785 MHz, reception band: 1805-1880 MHz), for example, a signal path 31L that is preferably used to propagate signals of Band 8 of the LTE standard (transmission band: 880-915 MHz, reception band: 925-960 MHz), for example, a first circuit 51L, a second circuit 51H, and duplexers 41H and 41L.

The front-end module 1 is a multi-carrier transmission/reception device that is provided with a plurality of signal paths to transmit and receive wireless signals using a plurality of frequency bands in order to support multiple modes/multiple bands. In the present preferred embodiment, Band 3 and Band 8 of the 3G/4G LTE standard are provided as the plurality of frequency bands. Signals in which Band 3 and Band 8 are used as carrier waves are respectively propagated along the signal paths 31H and 31L using a frequency division duplexing (FDD) method.

The front-end module 1 according to the present preferred embodiment may include signal paths along which signals of other frequency bands propagate, not just those of Band 3 and Band 8, and may include signal paths along which signals of frequency bands used in the TDD method propagate, not just those used in the FDD method.

Signal processing using the FDD method is performed along the signal paths 31H and 31L, and therefore, the duplexers 41H and 41L, which are capable of simultaneously transmitting and receiving signals, are respectively arranged along the signal paths 31H and 31L. Duplexers do not need to be arranged in the case of signal paths along which signal processing using the TDD method is performed.

The transmission paths (Tx) of the signal paths 31H and 31L are respectively connected to a transmission processing circuit (not illustrated), which amplifies transmission waves in advance, via transmission terminals 611H and 611L. In addition, reception paths (Rx) of the signal paths 31H and 31L are respectively connected to a reception processing circuit (not illustrated), such as a low-noise amplifier, for example, via reception terminals 612H and 612L.

Here, in the front-end module 1 according to the present preferred embodiment, a carrier aggregation (CA) method in which different frequency bands are simultaneously used is provided in order to improve communication quality. In other words, communication is performed by simultaneously using, as carrier waves, a second frequency band selected from among frequency bands belonging to a high-frequency band group and a first frequency band selected from among frequency bands belonging to a low-frequency band group. More specifically, Band 3, which belongs to a high-frequency band group, and Band 8, which belongs to a low-frequency band group, for example, are preferably simultaneously used in this preferred embodiment.

The diplexer 11 splits a wireless signal input from the antenna element 2 into a low-frequency band group (low-band section 10L: for example, 700 MHz-1 GHz) or a high-frequency band group (high-band section 10H: for example, 1.7 GHz-2.2 GHz), and outputs the signal to the antenna switch module 21. In addition, the diplexer 11 outputs transmission signals, which are input thereto from the signal paths via the antenna switch module 21, to the antenna element 2.

The antenna switch module 21 switches the connections between the antenna element 2 and the plurality of signal paths by connecting the antenna element 2 and at least two signal paths from among the plurality of signal paths to each other. More specifically, the antenna switch module 21 includes high-frequency switches 21H and 21L. The high-frequency switch 21H includes a high-frequency-side input terminal 121H that is connected to the diplexer 11, and a plurality of output terminals that are respectively connected to the plurality of signal paths of the high-band section 10H. The high-frequency-side input terminal 121H is exclusively connected to one signal path of the signal paths of the high-band section 10H that includes the Band 3 signal path 31H. The high-frequency switch 21L includes a low-frequency-side input terminal 121L that is connected to the diplexer 11 and a plurality of output terminals that are respectively connected to the plurality of signal paths of the low-band section 10L. The low-frequency-side input terminal 121L is exclusively connected to one signal path of the signal paths of the low-band section 10L that includes the Band 8 signal path 31L. That is, the antenna switch module 21 includes two single-input multiple-output high-frequency switches corresponding to the high-frequency band group and the low-frequency band group, and is able to simultaneously connect to the Band 3 signal path 31H of the high-band section 10H and the Band 8 signal path 31L of the low-band section 10L.

The first circuit 51L is connected to the signal path 31L (first signal path) that is used to propagate Band 8 (first frequency band) signals. In addition, the second circuit 51H is connected to the signal path 31H (second signal path) that is used to propagate Band 3 (second frequency band) signals. Here, the first circuit 51L and the second circuit 51H are electromagnetic-field coupled with each other.

The first circuit 51L preferably includes an inductor 151L (first inductance element), for example. The two terminals of the inductor 151L are respectively connected to the signal path 31L and a ground terminal.

The second circuit 51H preferably includes an inductor 151H (second inductance element), for example. The two terminals of the inductor 151H are respectively connected to the signal path 31H and a ground terminal.

In the present preferred embodiment, the frequency of a second-order harmonic component of a Band 8 (first frequency band) transmission signal (transmission band: 880-915 MHz) is in the Band 3 (second frequency band) reception band (1805-1880 MHz). In other words, the frequency of a harmonic of the transmission signal of the first frequency band is in the second frequency band. Due to this frequency relationship, there is a possibility that the second-order harmonic component of the Band 8 transmission signal that propagates along the signal path 31L from the transmission processing circuit may propagate into the reception path (Rx) of the signal path 31H via the antenna switch module and the diplexer (path A). In such a case, there is a possibility of the Band 3 reception sensitivity being degraded in a state in which Band 8 and Band 3 are subjected to a CA operation.

However, in the front-end module 1 according to the present preferred embodiment, the first circuit 51L and the second circuit 51H, which are electromagnetic-field coupled with each other, are respectively connected to the signal paths 31L and 31H.

In this case, the first circuit 51L and the second circuit 51H are structured and function such that a second-order harmonic component of the Band 8 transmission signal that propagates from the signal path 31L to the signal path 31H via the first circuit 51L and the second circuit 51H (without passing through the antenna switch module 21) (path B) cancels out a second-order harmonic component that propagates from the signal path 31L to the signal path 31H via the antenna switch module 21 (path A). More specifically, the inductors 151L and 151H are arranged such that the signal phases of the second-order harmonic component that propagates along path A and the second-order harmonic component that propagates along path B are shifted relative to each other. The inductors 151L and 151H are preferably arranged such that the second-order harmonic component that propagates along path A and the second-order harmonic component that propagates along path B have identical or substantially identical signal amplitudes and an inverse phase relationship with each other.

The amplitude and phase of the signal that propagates between the signal path 31L and the signal path 31H without passing through the antenna switch module 21 are able to be easily adjusted by adjusting the degree of electromagnetic-field coupling between the first circuit 51L and the second circuit 51H described above. Therefore, excellent isolation characteristics are provided between a plurality of frequency bands in the CA method.

Figure 2:
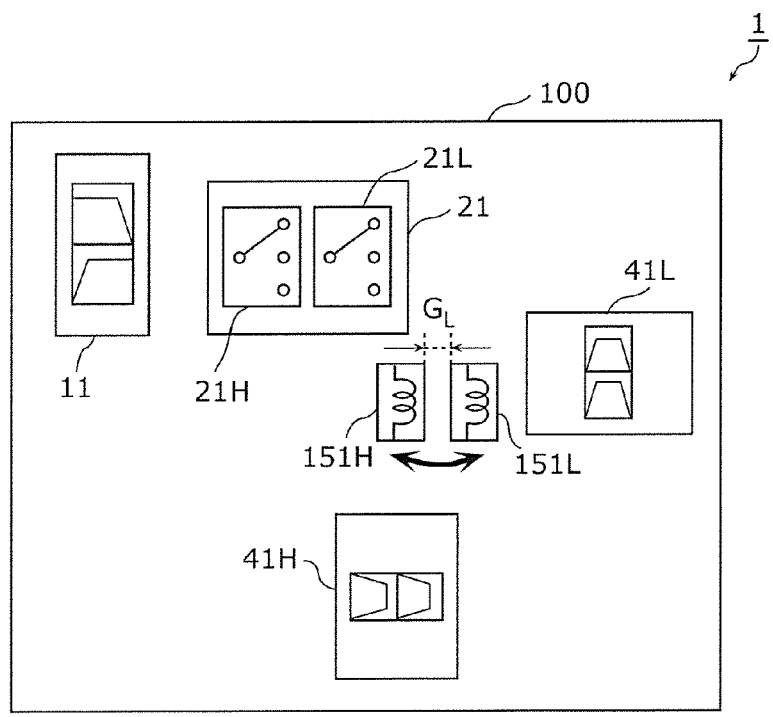
FIG. 2 is a schematic plan view illustrating the mounting layout of the front-end module according to preferred embodiment 1 of the present invention.

FIG. 2 is a schematic plan view illustrating the mounting layout of the front-end module 1 according to preferred embodiment 1. As illustrated in the figure, the diplexer 11, the antenna switch module 21, the duplexers 41H and 41L, and the inductors 151H and 151L are mounted on a mounting surface of a module substrate 100 in the front-end module 1. The wiring lines that connect the mounted circuit components to each other are not illustrated.

The module substrate 100 may be a multilayer substrate or a single-layer substrate, and a ceramic or a resin be used as the material thereof.

The antenna switch module 21 is a circuit component in which the high-frequency switches 21H and 21L, which are each defined by a single chip, are packaged as a single component.

The diplexer 11, and the duplexers 41H and 41L are preferably packaged circuit components. The high-frequency switches 21H and 21L, the diplexer 11, and the duplexers 41H and 41L may, instead, be non-packaged components, and, for example, may be directly provided in a module substrate 100 having a cavity structure.

The inductors 151H and 151L are preferably chip inductors.

Although the circuit components are preferably mounted on the same mounting surface in this preferred embodiment, the circuit components may, instead, be provided in a distributed manner on opposing front and rear surfaces. In addition, the circuit components do not need to be provided on a single module substrate 100, and may instead be provided in a distributed manner across a plurality of substrates.

The mounting layout of the front-end module 1 illustrated in FIG. 2 reflects the connection relationships of the circuit components in the circuit configuration diagram illustrated in FIG. 1. That is, preferably, the mounting layout illustrated in FIG. 2 is a layout in which the wiring lines that connect the circuit components are in principle the shortest. Here, the degree of electromagnetic-field coupling between the chip inductor 151H and inductor 151L greatly depends on a gap $G_L$ between the inductors 151H and 151L.

Figure 3:
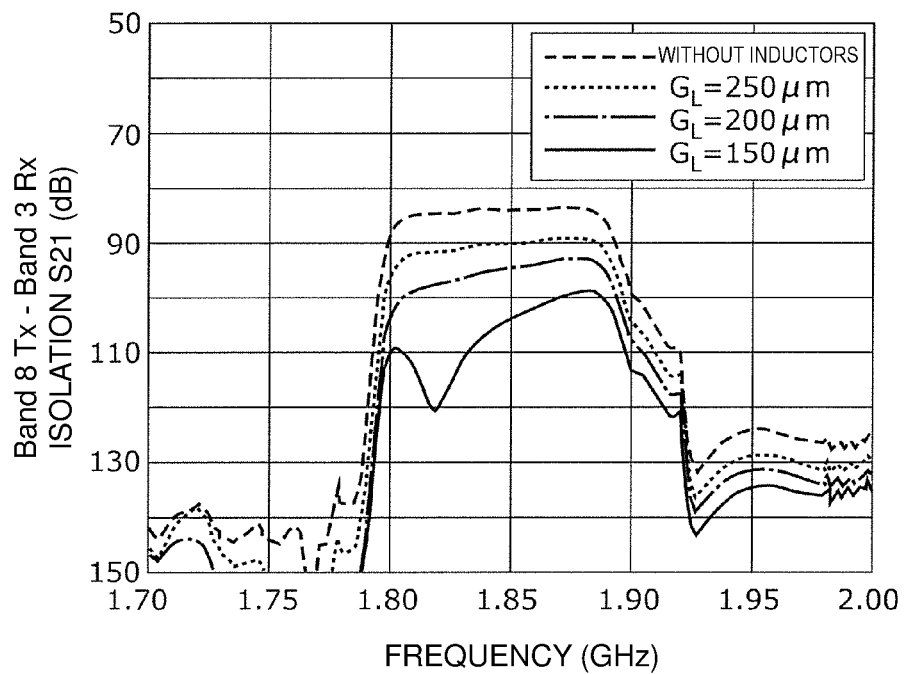
FIG. 3 illustrates graphs showing the isolation characteristics of the front-end module according to preferred embodiment 1 of the present invention.

FIG. 3 illustrates graphs showing the isolation characteristics of the front-end module 1 according to preferred embodiment 1. More specifically, values of isolation (S21) between the Band 8 transmission path (Tx) and the Band 3 reception path (Rx) obtained while varying the gap $G_L$ are illustrated in FIG. 3. In this case, preferably, the inductance value of the inductor 151H is about 3.0 nH and the inductance value of the inductor 151L is about 7.5 nH, for example.

As illustrated by the graphs in FIG. 3, the isolation (S21) in the Band 3 reception band (1805-1880 MHz) is improved in the cases in which the inductors 151H and 151L are provided (labeled as $G_L$=250 µm, 200 µm, and 150 µm in FIG. 3) compared to the case in which the inductors 151H and 151L are not provided (labeled as "without inductors" in the figure).

In addition, when the inductors 151H and 151L are provided, the isolation (S21) is improved to a greater extent as the gap $G_L$ decreases. This is understood to be because the degree of electromagnetic-field coupling between the inductors 151H and 151L increases as the gap $G_L$ decreases for the combination of the inductor 151H (about 3.0 nH) and the inductor 151L (about 7.5 nH) for which the inductance values have been selected as described above. In other words, this is understood to be because as the gap $G_L$ decreases, the second harmonic component of the Band 8 transmission wave that propagates along path A in FIG. 1 and the second harmonic component of the Band 8 transmission wave that propagates along path B in FIG. 1 get closer to having identical or substantially identical amplitudes and being in an inverse phase relationship with each other.

In the graphs illustrated in FIG. 3, when the gap $G_L$ is about 150 µm, an improvement in isolation of about 15-30 dB is achieved in the Band 3 reception band (1805-1880 MHz) compared to the case in which the inductors 151H and 151L are not provided.

Figure 4:
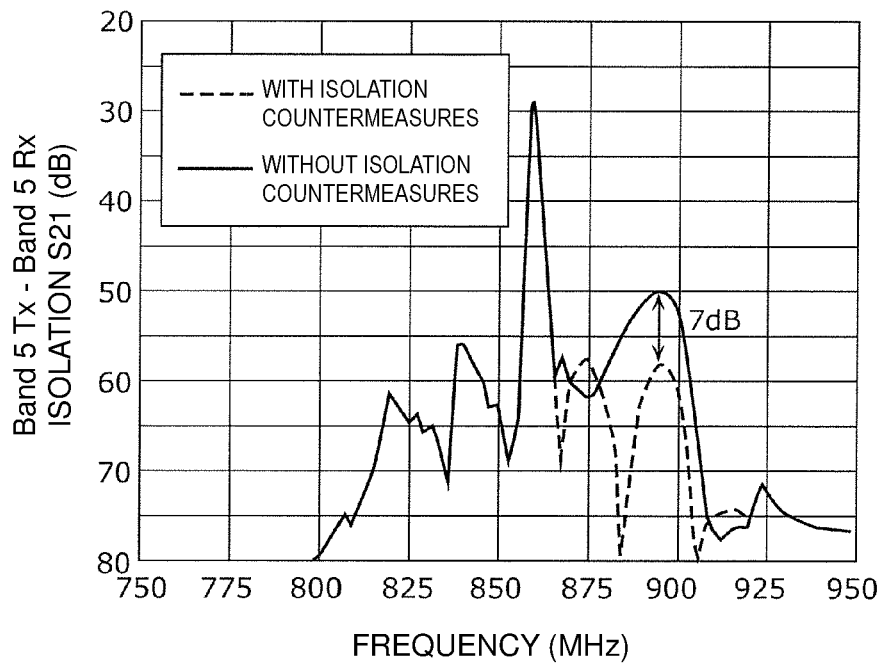
FIG. 4 is a graph showing the isolation characteristics of a front-end module according to a comparative example.

FIG. 4 is a graph depicting the isolation characteristics of a front-end module according to a comparative example. More specifically, isolation (S21) between a transmission band (Tx) and a reception band (Rx) inside the same frequency band (Band 5) is illustrated. In this comparative example, in a configuration in which a transmission band pass filter is arranged along a Band 5 transmission path (Tx) and a reception band pass filter is similarly arranged along a Band 5 reception path (Rx), an inductor provided inside the transmission band pass filter and an inductor that is shunt-connected along a path in which the transmission path and the reception path of Band 5 join together (path on antenna side of transmission band pass filter and reception band pass filter) are electromagnetic-field coupled with each other.

With this configuration, as illustrated in the graph of FIG. 4, in the case in which electromagnetic-field coupling is performed inside the same frequency band (labeled as "with isolation countermeasures" in the figure), an improvement in isolation of about 7 dB is achieved in the Band 5 reception band (869-894 MHz) compared to the case in which electromagnetic-field coupling is not performed (labeled as "without isolation countermeasures" in the figure).

This is understood to be because there is a function in which a Band 5 transmission signal that propagates from the transmission path (Tx) to the reception path (Rx) through the electromagnetic-field coupling cancels out a Band 5 transmission signal that propagates from the transmission path (Tx) to the reception path (Rx) without being propagated through the electromagnetic-field coupling.

The configuration of the front-end module according to comparative example 1 differs from the configuration of the front-end module 1 according to the present preferred embodiment in the following ways:

(1) Signals are simultaneously transmitted and received in one frequency band (Band 5); and (2) The frequency of the reception signal and the frequency of the transmission signal that flows into the reception path are in the same frequency band (Band 5) but have different frequencies.

With the configuration of the front-end module 1 according to the present preferred embodiment, the front-end module 1 is able to have isolation characteristics (about 15-30 dB, for example) that are better than the isolation characteristics of comparative example 1 (about 7 dB) despite the fact that the frequency of a harmonic of a transmission wave that belongs to a low-frequency band group and the fundamental frequency of a reception wave that belongs to a high-frequency band group, which includes different frequency bands from the low-frequency band group, that are subjected to a CA operation match or substantially match each other.

In the present preferred embodiment, high isolation characteristics are achieved even between signal paths used for propagation of different frequency bands by adjusting the gap between two inductors that are respectively connected to signal paths, which are subjected to a CA operation. In other words, the amplitude and phase of a signal that propagates between the two inductors without passing through the antenna switch module 21 are able to be easily adjusted even between signal paths that are used for propagation of different frequency bands by adjusting the distance between the two inductors.

The space between the chip inductors 151H and 151L may preferably be filled with resin or other suitable material. The degree of electromagnetic-field coupling may be further adjusted in this manner.

Figure 5:
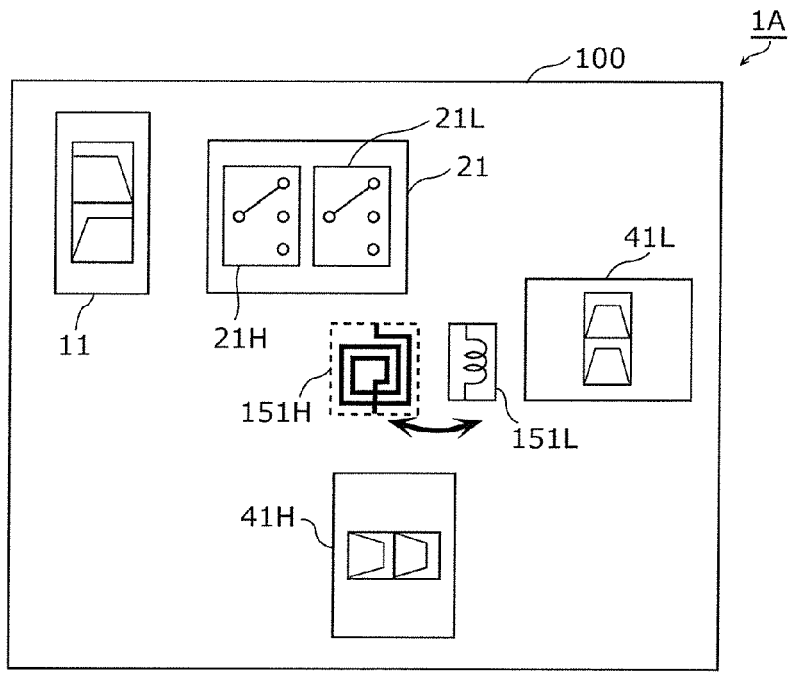
FIG. 5 is a schematic plan view illustrating the mounting layout of a front-end module according to modification 1 of preferred embodiment 1 of the present invention.

FIG. 5 is a schematic plan view illustrating the mounting layout of a front-end module 1A according to modification 1 of preferred embodiment 1. As illustrated in FIG. 5, the diplexer 11, the antenna switch module 21, the duplexers 41H and 41L, and the inductors 151H and 151L are mounted on the mounting surface of the module substrate 100 in the front-end module 1A. The wiring lines that connect the mounted circuit components to each other are not illustrated.

The arrangement layout of the front-end module 1A according to this modification differs from the arrangement layout of the front-end module 1 according to preferred embodiment 1 only in that one of the two inductors is preferably an inductor element that is built into the module substrate 100. Hereafter, description of portions of the front-end module 1A according to this modification that are the same or substantially the same as the front-end module 1 according to preferred embodiment 1 is omitted, and the description focuses on the portions that are different.

The inductor 151H is preferably a second inductance element that is built into the module substrate 100, and, for example, includes a coil pattern that is stacked inside the module substrate 100.

The inductor 151L is preferably a chip first inductance element that is mounted on the module substrate 100.

With this configuration, since the inductor 151H, which defines the second circuit, is built into the inside of the module substrate 100, the number of circuit components mounted on the module substrate 100 is reduced, and the degree of freedom of the arrangement layout of the other circuit components is improved.

In this case, the degree of electromagnetic-field coupling between chip inductors 151H and 151L greatly depends on the distance between the inductors 151H and 151L, but since the inductor 151L and the inductor 151H are able to be located close to each other in a direction perpendicular or substantially perpendicular to the module substrate 100, the degree of electromagnetic-field coupling therebetween is able to be increased.

The configurations of the inductors 151H and 151L may be reversed. That is, the inductor 151H may be a chip second inductance element that is mounted on the module substrate 100, and the inductor 151L may be a first inductance element that is built into the module substrate 100.

However, generally, a higher inductance value is able to be provided with a chip inductance element than with an inductance element that is built into the inside of a substrate. From this viewpoint, taking into consideration matching of the complex impedances (jωL) of the first circuit 51L and the second circuit 51H defined by the inductance elements, it is preferable that the inductor 151L that is connected to the signal path that belongs to the low-frequency band group be a chip inductance element that is able to produce a relatively large inductance value and that the inductor 151H that is connected to the signal path that belongs to the high-frequency band group be an inductance element that is built into the inside of a substrate that is able to produce a relatively small inductance value. That is, when performing impedance matching, a chip inductance element and an inductance element that is built into the inside of a substrate may be used as appropriate in accordance with the frequency bands.

Figure 6:
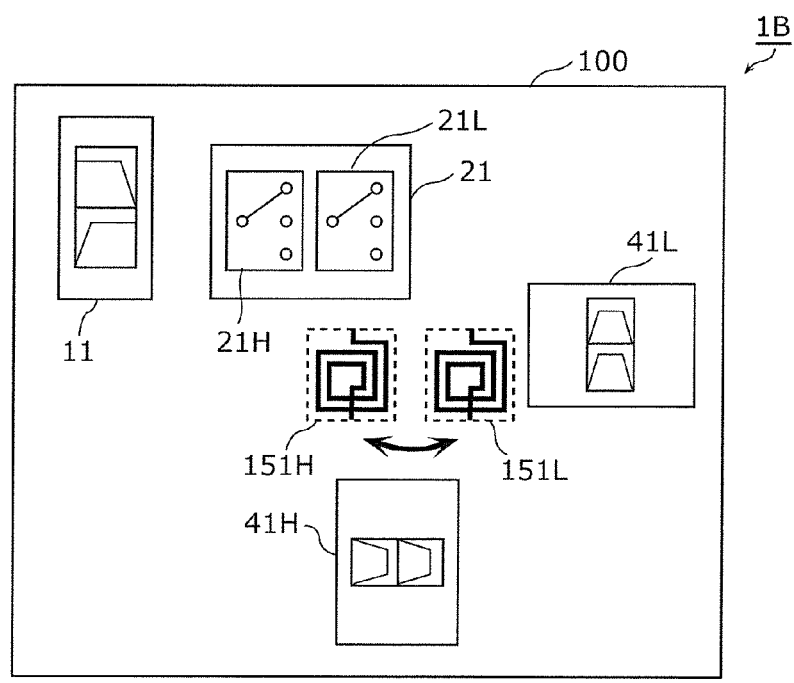
FIG. 6 is a schematic plan view illustrating the mounting layout of a front-end module according to modification 2 of preferred embodiment 1 of the present invention.

FIG. 6 is a schematic plan view illustrating the mounting layout of a front-end module 1B according to modification 2 of preferred embodiment 1. As illustrated in FIG. 6, the diplexer 11, the antenna switch module 21, the duplexers 41H and 41L, and the inductors 151H and 151L are mounted on the mounting surface of the module substrate 100 in the front-end module 1B. The wiring lines that connect the mounted circuit components to each other are not illustrated.

The arrangement layout of the front-end module 1B according to this modification differs from the arrangement layout of the front-end module 1 according to preferred embodiment 1 only in that both of the two inductors are inductor elements that are built into the module substrate 100. Hereafter, description of portions of the front-end module 1B according to this modification that are the same or substantially the same as in the front-end module 1 according to preferred embodiment 1 is omitted, and the description focuses on the portions that are different.

The inductor 151H is preferably a second inductance element that is built into the module substrate 100, and, for example, includes a coil pattern that is stacked inside the module substrate 100.

The inductor 151L is preferably a first inductance element that is built into the module substrate 100, and, for example, includes a coil pattern that is stacked inside the module substrate 100.

With this configuration, since both of the inductor elements that define the first circuit and the second circuit are built into the inside of the module substrate 100, the number of circuit components mounted on the module substrate 100 is reduced, and the degree of freedom of the arrangement layout of the other circuit components is improved.

Preferred Embodiment 2

Figure 7:
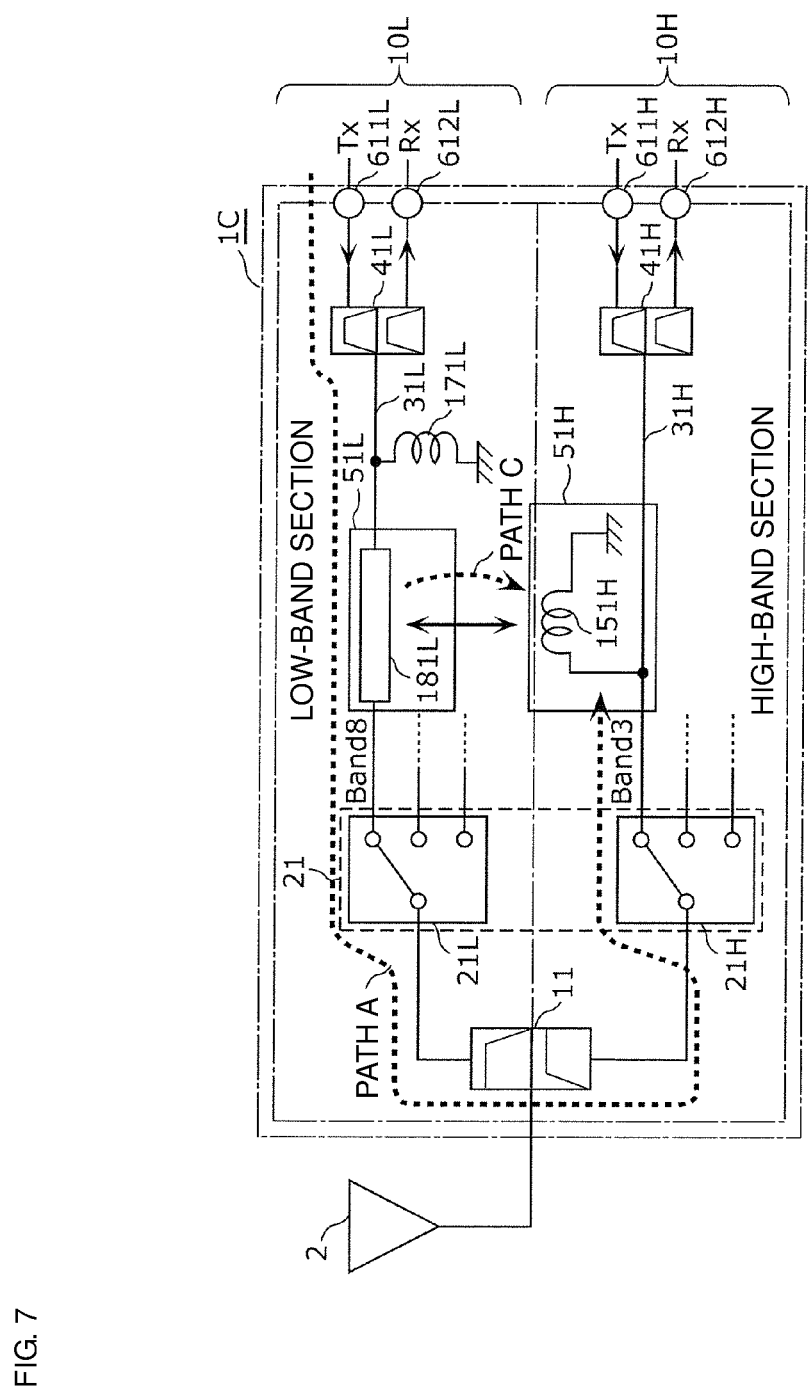
FIG. 7 is a circuit configuration diagram of a front-end module according to preferred embodiment 2 of the present invention.

FIG. 7 is a circuit configuration diagram of a front-end module 1C according to preferred embodiment 2. In FIG. 7, the front-end module 1C according to preferred embodiment 2 and an antenna element 2 are illustrated. The front-end module 1C according to the present preferred embodiment differs from the front-end module 1 according to preferred embodiment 1 only in terms of the circuit configuration of the first circuit 51L. Hereafter, description of portions of the front-end module 1C according to the present preferred embodiment that are the same or substantially the same as the front-end module 1 according to preferred embodiment 1 is omitted, and the description focuses on the portions that are different.

The first circuit 51L is connected to the signal path 31L (first signal path) that is used to propagate Band 8 (first frequency band) signals. In addition, the second circuit 51H is connected to the signal path 31H (second signal path) that is used to propagate Band 3 (second frequency band) signals. Here, the first circuit 51L and the second circuit 51H are electromagnetic-field coupled with each other.

The first circuit 51L includes a wiring line 181L, which is exemplified by a microstrip line, for example. The wiring line 181L is inserted as a portion of the signal path 31L.

The second circuit 51H preferably includes the inductor 151H (inductance element), for example. The two terminals of the inductor 151H are respectively connected to the signal path 31H and a ground terminal.

The wiring line 181L and the inductor 151H are electromagnetic-field coupled with each other.

An inductor 171L is an inductance element that performs impedance matching, and is not an essential element of the present invention.

The first circuit 51L and the second circuit 51H, which are electromagnetic-field coupled with each other, are respectively connected to the signal paths 31L and 31H in the front-end module 1C according to this preferred embodiment.

In this case, the first circuit 51L and the second circuit 51H are structured and function such that a second-order harmonic component of the Band 8 transmission signal that propagates from the signal path 31L to the signal path 31H via the first circuit 51L and the second circuit 51H (not passing through the antenna switch module 21) (path C) cancels out a second-order harmonic component that propagates from the signal path 31L to the signal path 31H via the antenna switch module 21 (path A). More specifically, the wiring line 181L and the inductor 151H are arranged such that the signal phases of the second-order harmonic component that propagates along path A and the second-order harmonic component that propagates along the path C are shifted relative to each other. The positions of the wiring line 181L and the inductor 151H are preferably optimized such that the signal amplitudes of the second-order harmonic component that propagates along path A and the second-order harmonic component that propagates along path C are closer to being identical or substantially identical to each other and the phases of the second-order harmonic components have an inverse relationship with each other.

The amplitude and phase of the signal that propagates between the signal path 31L and the signal path 31H without passing through the antenna switch module 21 are able to be easily adjusted by adjusting the degree of electromagnetic-field coupling between the first circuit 51L and the second circuit 51H described above. Therefore, excellent isolation characteristics are provided between a plurality of frequency bands in the CA method.

In addition, the circuit configurations of the first circuit 51L and the second circuit 51H may be reversed. In other words, the first circuit 51L may include an inductor element, and the second circuit 51H may include a wiring line, for example.

In addition, both of the first circuit 51L and the second circuit 51H may include wiring lines that are electromagnetic-field coupled with each other.

Figure 8:
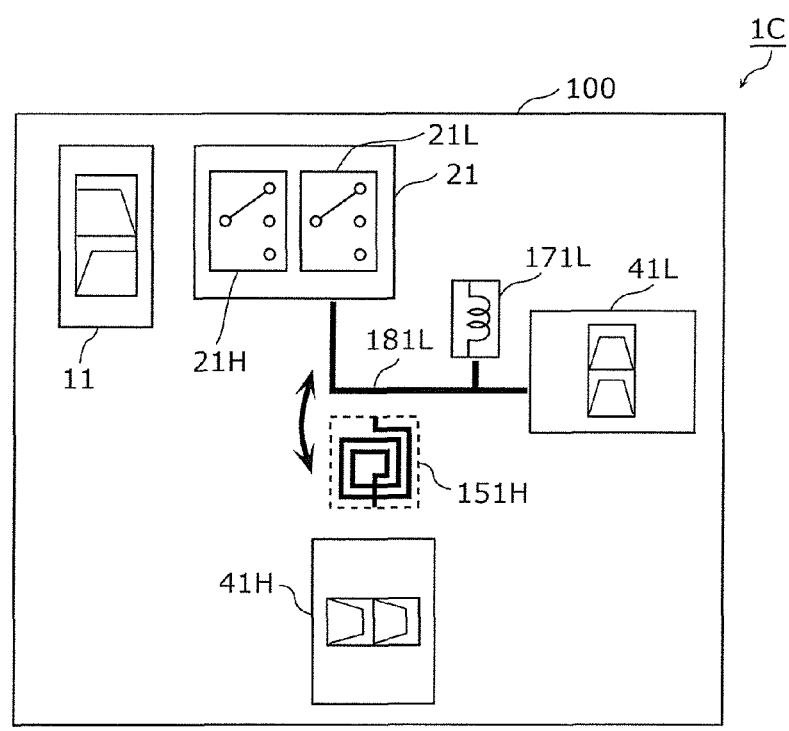
FIG. 8 is a schematic plan view illustrating the mounting layout of the front-end module according to preferred embodiment 2 of the present invention.

FIG. 8 is a schematic plan view illustrating the mounting layout of the front-end module 1C according to preferred embodiment 2. As illustrated in FIG. 8, the diplexer 11, the antenna switch module 21, the duplexers 41H and 41L, inductors 151H and 171L, and the wiring line 181L are mounted on the mounting surface of the module substrate 100 in the front-end module 1C. The wiring lines that connect the mounted circuit components to each other are not illustrated.

The inductor 151H is preferably a second inductance element that is built into the module substrate 100, and for example, includes a coil pattern that is stacked inside the module substrate 100.

The wiring line 181L is preferably a high-frequency transmission line that is provided on the module substrate 100, and includes a micro-strip line that is provided on the module substrate 100, for example.

The inductor 171L is a chip impedance-matching inductance element that is mounted on the module substrate 100.

In this case, the degree of electromagnetic-field coupling between the inductor 151H and the wiring line 181L strongly depends on the arrangement relationship between the inductor 151H and the wiring line 181L.

Thus, it is possible to generate a Band 8 second-order harmonic component that propagates from the Band 8 signal path 31L to the signal path 31H via the first circuit 51L and the second circuit 51H through the electromagnetic-field coupling between the wiring line 181L and the inductor 151H.

Therefore, the amplitude and phase of the signal that propagates between the signal path 31L and the signal path 31H without passing through the antenna switch module 21 are able to be easily adjusted by adjusting the degree of electromagnetic-field coupling between the first circuit 51L and the second circuit 51H described above. In addition, the amplitude and phase of the electromagnetic-field coupling signal are able to be changed by adjusting the location of electromagnetic-field coupling between the wiring line 181L and the inductor 151H. In other words, the second-order harmonic component of the Band 8 transmission signal that propagates along path B is able to cancel out the second-order harmonic component that propagates along path A. Therefore, excellent isolation characteristics are provided between a plurality of frequency bands in the CA method.

In addition, the inductor 151H may be a chip inductance element.

Preferred Embodiment 3

In preferred embodiment 3, a front-end module 1D is described that is obtained by adding, to a configuration in which the isolation characteristics of a first frequency band and a second frequency band that are subjected to a CA operation are improved as in preferred embodiments 1 and 2, a configuration that improves isolation characteristics inside a third frequency band that is not subjected to a CA operation with the two frequency bands.

Figure 9:
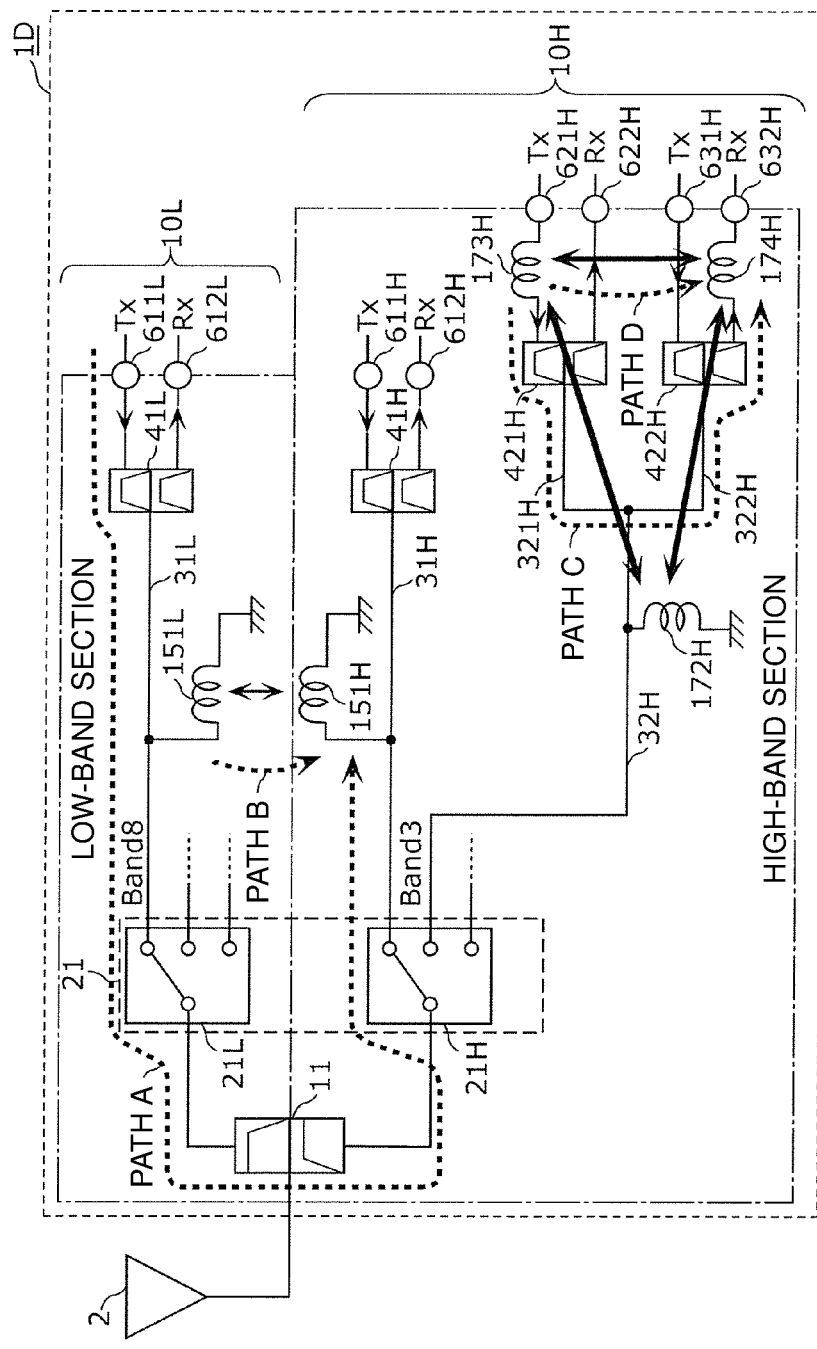
FIG. 9 is a circuit configuration diagram of a front-end module according to preferred embodiment 3 of the present invention.

FIG. 9 is a circuit configuration diagram of the front-end module 1D according to preferred embodiment 3. In FIG. 9, the front-end module 1D according to preferred embodiment 3 and an antenna element 2 are illustrated. The front-end module 1D and the antenna element 2 are preferably arranged in the front end of a cellular phone that supports multiple modes/multiple bands, for example.

The front-end module 1D includes the diplexer 11, the antenna switch module 21, the signal path 31H (second signal path) that is used to propagate signals of Band 3 (second frequency band) of the LTE standard, for example, the signal path 31L (first signal path) that is used to propagate signals of Band 8 (first frequency band) of the LTE standard, for example, a signal path 32H (third signal path) that is used to propagate signals of a frequency band that belongs to the high-band section 10H (third frequency band), inductors 151L, 151H, 172H, 173H, and 174H, and duplexers 41L, 41H, 421H, and 422H. In addition, the signal path 32H branches into signal paths 321H (fourth signal path) and 322H (fifth signal path), at a branching node, that are used to propagate signals of the third frequency band.

The antenna switch module 21 includes high-frequency switches 21H and 21L. The high-frequency switch 21H includes a high-frequency-side input terminal that is connected to the diplexer 11, and a plurality of output terminals that are respectively connected to the plurality of signal paths of the high-band section 10H. The high-frequency-side input terminal is exclusively connected to one signal path among the signal paths of the high-band section 10H that includes the signal path 31H and the signal path 32H of Band 3. On the other hand, the high-frequency switch 21L includes a low-frequency-side input terminal that is connected to the diplexer 11 and a plurality of output terminals that are respectively connected to the plurality of signal paths of the low-band section 10L. The low-frequency-side input terminal is exclusively connected to one signal path among the signal paths of the low-band section 10L that includes the Band 8 signal path 31L. That is, the antenna switch module 21 includes two single-input multiple-output high-frequency switches corresponding to the high-frequency band group and the low-frequency band group, and is able to simultaneously connect to the Band 3 signal path 31H or 32H of the high-band section 10H and the Band 8 signal path 31L of the low-band section 10L.

The inductor 151L defines a first circuit, and is connected in parallel with the signal path 31L. The inductor 151H defines a second circuit, and is connected in parallel with the signal path 31H. The inductor 172H defines a third circuit, and is connected in parallel with the signal path 32H. The inductor 173H defines a fourth circuit, and is connected in series with the signal path 321H. The inductor 174H defines a fifth circuit, and is connected in series with the signal path 322H.

The duplexer 41L is located between the transmission terminal 611L and the reception terminal 612L, and the signal path 31L. The duplexer 41H is located between the transmission terminal 611H and the reception terminal 612H, and the signal path 31H. The duplexer 421H is located between a transmission terminal 621H and a reception terminal 622H, and the signal path 321H. The duplexer 422H is located between a transmission terminal 631H and a reception terminal 632H, and the signal path 322H. The duplexers 421H and 422H define a quadplexer for the third frequency band.

Here, the first circuit and the second circuit are electromagnetic-field coupled with each other.

In the present preferred embodiment, the frequency of the second-order harmonic component of Band 8 is included in the reception band of Band 3. In other words, the frequency of a harmonic of the transmission signal of the first frequency band is included in the second frequency band. Because of this frequency relationship, there is a possibility that the second-order harmonic component of the Band 8 transmission signal that propagates along the signal path 31L from the transmission processing circuit may propagate into the reception path (Rx) of the signal path 31H via the antenna switch module and the diplexer 11. In this case, there is a possibility of the Band 3 reception sensitivity being degraded in a state in which Band 8 and Band 3 are subjected to a CA operation.

However, the first circuit and the second circuit, which are electromagnetic-field coupled with each other, are respectively connected to the signal paths 31L and 31H in the front-end module 1D according to the present preferred embodiment.

Thus, the first circuit and the second circuit are structured and function such that a second-order harmonic component of the Band 8 transmission signal that propagates from the signal path 31L to the signal path 31H via the first circuit and the second circuit (not via the antenna switch module 21) (path B) cancels out a second-order harmonic component that propagates from the signal path 31L to the signal path 31H via the antenna switch module 21 (path A). More specifically, the inductors 151L and 151H are arranged such that the signal phases of the second-order harmonic component that propagates along path A and the second-order harmonic component that propagates along path B are shifted relative to each other. The inductors 151L and 151H are preferably arranged such that the second-order harmonic component that propagates along path A and the second-order harmonic component that propagates along path B have identical or substantially identical signal amplitudes and an inverse phase relationship with each other.

The amplitude and phase of the signal that propagates between the signal path 31L and the signal path 31H without passing through the antenna switch module 21 are able to be easily adjusted by adjusting the degree of electromagnetic-field coupling between the first circuit 51L and the second circuit 51H described above. Therefore, excellent isolation characteristics are provided between a plurality of frequency bands in the CA method.

In addition, two circuits among the third circuit, the fourth circuit, and the fifth circuit are electromagnetic-field coupled with each other.

In this case, there is a possibility that a transmission signal that propagates along the signal path 321H may propagate into the reception path (Rx) of the signal path 322H via the connection point (branching point) between the signal paths 32H, 421H, and 422H. In this case, it is possible that the reception sensitivity of a reception signal that propagates along the signal path 322H may be degraded.

However, in the front-end module 1D according to the present preferred embodiment, the third circuit, the fourth circuit, and the fifth circuit are respectively connected to the signal paths 32H, 321H, and 322H.

Thus, the amplitude and phase of the signal that propagates between the signal path 321H and the signal path 322H without passing through the connection point (branching point) between the signal paths 32H, 421H, and 422H are able to be easily adjusted by adjusting the degree of electromagnetic-field coupling between two circuits among the third circuit, the fourth circuit, and the fifth circuit. Therefore, a transmission signal component that propagates from the signal path 321H to the signal path 322H without passing through the connection point (branching point) between the signal paths 32H, 421H, and 422H (path D) cancels out a transmission signal component that propagates from the signal path 321H to the signal path 322H via the connection point (path C).

Thus, excellent isolation characteristics are provided between a plurality of frequency bands that are subjected to a CA operation, and isolation characteristics are able to be provided for transmission and reception signals within the same frequency band.

In the present preferred embodiment, an example has been described in which the third frequency band belongs to the high-band section 10H, but the third frequency band may, instead, belong to the low-band section 10L.

Figure 10:
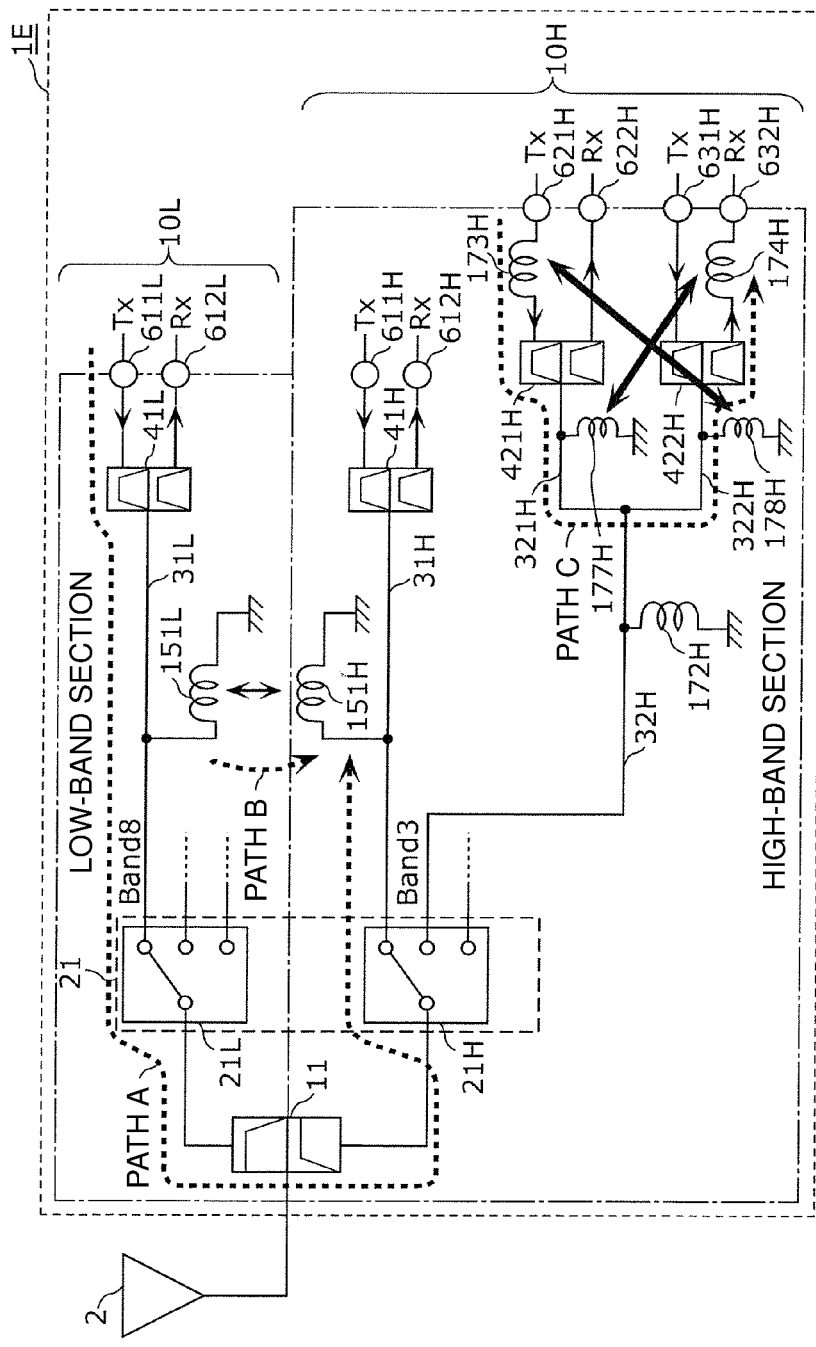
FIG. 10 is a circuit configuration diagram of a front-end module according to a modification of preferred embodiment 3 of the present invention.

FIG. 10 is a circuit configuration diagram of a front-end module 1E according to a modification of preferred embodiment 3.

In this modification, the configuration that improves isolation characteristics inside the third frequency band which is not subjected to a CA operation with the first frequency band and the second frequency band, is different from that in the front-end module 1D according to preferred embodiment 3. Hereafter, description of portions of the configuration of the front-end module 1E according to this modification that are the same or substantially the same as in the front-end module 1D according to preferred embodiment 3 is omitted, and the description focuses on the portions of the configuration that are different.

The front-end module 1E includes the diplexer 11, the antenna switch module 21, the signal path 31H (second signal path) that is used to propagate signals of Band 3 (second frequency band) of the LTE standard, for example, the signal path 31L (first signal path) that is used to propagate signals of Band 8 (first frequency band) of the LTE standard, for example, the signal path 32H (third signal path) that is used to propagate signals of a frequency band that belongs to the high-band section 10H (third frequency band), inductors 151L, 151H, 172H, 173H, 174H, 177H, and 178H, and duplexers 41L, 41H, 421H, and 422H. In addition, the signal path 32H branches, at a branching node, into the signal paths 321H (fourth signal path) and 322H (fifth signal path) that are used to propagate signals of the third frequency band.

The inductor 151L defines a first circuit, and is connected in parallel with the signal path 31L. The inductor 151H defines a second circuit, and is connected in parallel with the signal path 31H. The inductor 172H defines a third circuit, and is connected in parallel with the signal path 32H. The inductor 173H defines a portion of a fourth circuit, and is connected in series with the transmission path of the signal path 321H. The inductor 174H defines a fifth circuit, and is connected in series with the reception path of the signal path 322H. In addition, the inductor 177H defines a portion of the fourth circuit, and is connected in series with a transmission/reception path of the signal path 321H. The inductor 178H defines a portion of the fifth circuit, and is connected in series with a transmission/reception path of the signal path 322H.

Here, the first circuit and the second circuit are electromagnetic-field coupled with each other.

The amplitude and phase of the signal that propagates between the signal path 31L and the signal path 31H without passing through the antenna switch module 21 are able to be easily adjusted by adjusting the degree of electromagnetic-field coupling between the first circuit 51L and the second circuit 51H described above. Therefore, excellent isolation characteristics are provided between a plurality of frequency bands in the CA method.

In addition, electromagnetic-field coupling between the inductor 177H (fourth circuit) and the inductor 174H (fifth circuit) and/or electromagnetic-field coupling between the inductor 173H (fourth circuit) and the inductor 178H (fifth circuit) is established.

In this case, there is a possibility that a transmission signal that propagates along the signal path 321H may propagate into the reception path (Rx) of the signal path 322H via the connection point (branching point) between the signal paths 32H, 421H, and 422H. In such a case, it is possible that the reception sensitivity of a reception signal that propagates along the signal path 322H may be degraded.

However, in the front-end module 1E according to this modification, the fourth circuit and the fifth circuit are respectively connected to the signal paths 321H and 322H.

Thus, the amplitude and phase of a signal that propagates between the signal path 321H and the signal path 322H without passing through the connection point (branching point) between the signal paths 32H, 421H, and 422H are able to be easily adjusted by adjusting the degree of electromagnetic-field coupling between the fourth circuit and the fifth circuit. Therefore, a transmission signal component that propagates from the signal path 321H to the signal path 322H without passing through the connection point (branching point) between the signal paths 32H, 421H, and 422H (path D) cancels out a transmission signal component that propagates from the signal path 321H to the signal path 322H via the connection point (path C).

Thus, excellent isolation characteristics are provided between a plurality of frequency bands that are subjected to a CA operation, and isolation characteristics are provided for transmission and reception signals within the same frequency band.

In this modification, an example has been described in which the third frequency band belongs to the high-band section 10H, but the third frequency band may instead belong to the low-band section 10L.

Preferred Embodiment 4

In preferred embodiment 4, a front-end module 1F is described that has a configuration that, as well as improving isolation characteristics of a first frequency band and a second frequency band that are subjected to a CA operation as in preferred embodiments 1 and 2, also improves isolation characteristics of a third frequency band that is subjected to a CA operation with the first frequency band and the second frequency band.

Figure 11:
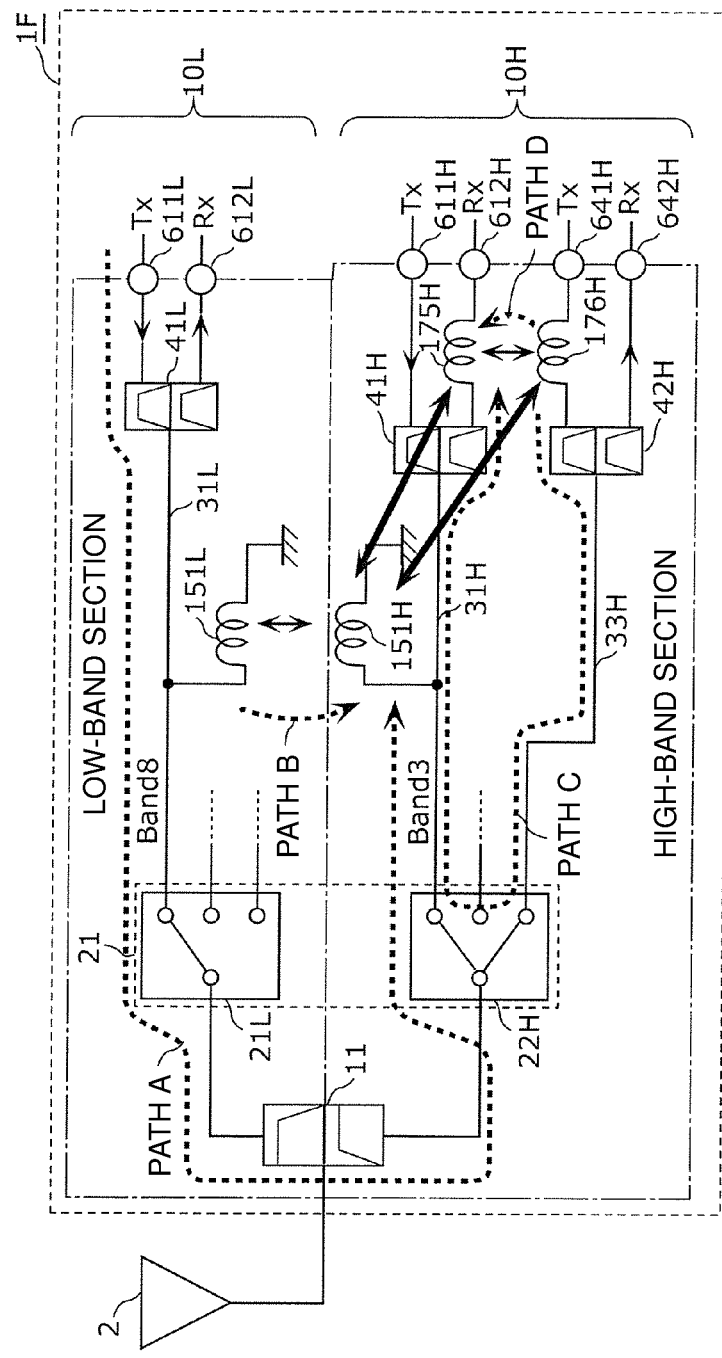
FIG. 11 is a circuit configuration diagram of a front-end module according to preferred embodiment 4 of the present invention.

FIG. 11 is a circuit configuration diagram of the front-end module 1F according to preferred embodiment 4. In FIG. 11, the front-end module 1F according to preferred embodiment 4 and an antenna element 2 are illustrated. The front-end module 1F and the antenna element 2 are preferably arranged in the front end of a cellular phone that supports multiple modes/multiple bands, for example.

The front-end module 1F includes the diplexer 11, the antenna switch module 21, the signal path 31H (second signal path) that is used to propagate signals of Band 3 (second frequency band) of the LTE standard, for example, the signal path 31L (first signal path) that is used to propagate signals of Band 8 (first frequency band) of the LTE standard, for example, a signal path 33H (third signal path) that is used for propagation of signals of a frequency band that belongs to the high-band section 10H (third frequency band), inductors 151L, 151H, 175H, and 176H, and duplexers 41L, 41H, and 42H.

The antenna switch module 21 includes high-frequency switches 21L and 22H. The high-frequency switch 22H is preferably a switch that supports direct-mapping, and includes a high-frequency-side input terminal that is connected to the diplexer 11, and a plurality of output terminals that are respectively connected to the plurality of signal paths of the high-band section 10H. The high-frequency-side input terminal is connected to two signal paths among the signal paths of the high-band section 10H that includes the signal path 31H of Band 3 and the signal path 33H. On the other hand, the high-frequency switch 21L includes a low-frequency-side input terminal that is connected to the diplexer 11 and a plurality of output terminals that are respectively connected to the plurality of signal paths of the low-band section 10L. The low-frequency-side input terminal is exclusively connected to one signal path among the signal paths of the low-band section 10L that includes the Band 8 signal path 31L. In other words, preferably the antenna switch module 21 is a two-path high-frequency switch 22H that supports the high-frequency band group, and a one-path high-frequency switch 21L that supports the low-frequency band group. With this configuration, the Band 3 signal path 31H of the high-band section 10H, the signal path 33H of the high-band section 10H, and the Band 8 signal path 31L of the low-band section 10L are simultaneously connected.

The inductor 151L defines a first circuit, and is connected in parallel with the signal path 31L. The inductor 151H defines a second circuit, and is connected in parallel with the signal path 31H. The inductor 176H defines a third circuit, and is connected in series with the transmission signal path of the signal path 33H. The inductor 175H defines a fourth circuit, and is serially connected to the reception signal path at a point downstream of a connection point between the signal path 31H and the second circuit.

The duplexer 41L is located between the transmission terminal 611L and the reception terminal 612L, and the signal path 31L. The duplexer 41H is located between the transmission terminal 611H and the reception terminal 612H, and the signal path 31H. The duplexer 42H is located between a transmission terminal 641H and a reception terminal 642H, and the signal path 33H.

Here, the first circuit and the second circuit are electromagnetic-field coupled with each other.

In the present preferred embodiment, the frequency of the second-order harmonic component of Band 8 is included in the reception band of Band 3. In other words, the frequency of a harmonic of the transmission signal of the first frequency band is included in the second frequency band. Because of this frequency relationship, there is a possibility that the second-order harmonic component of the Band 8 transmission signal that propagates along the signal path 31L from the transmission processing circuit may propagate into the reception path (Rx) of the signal path 31H via the antenna switch module and the diplexer 11. In this case, there is a possibility of the Band 3 reception sensitivity being degraded in a state in which Band 8 and Band 3 are subjected to a CA operation.

However, the first circuit and the second circuit, which are electromagnetic-field coupled with each other, are respectively connected to the signal paths 31L and 31H in the front-end module 1F according to the present preferred embodiment.

Thus, the first circuit and the second circuit are structured and function such that a second-order harmonic component of the Band 8 transmission signal that propagates from the signal path 31L to the signal path 31H via the first circuit and the second circuit (without passing through the antenna switch module 21) (path B) cancels out a second-order harmonic component that propagates from the signal path 31L to the signal path 31H via the antenna switch module 21 (path A). More specifically, the inductors 151L and 151H are arranged such that the signal phases of the second-order harmonic component that propagates along path A and the second-order harmonic component that propagates along path B are shifted relative to each other. The inductors 151L and 151H are preferably arranged such that the second-order harmonic component that propagates along path A and the second-order harmonic component that propagates along path B have identical or substantially identical signal amplitudes and an inverse phase relationship with each other.

The amplitude and phase of the signal that propagates between the signal path 31L and the signal path 31H without passing through the antenna switch module 21 are able to be easily adjusted by adjusting the degree of electromagnetic-field coupling between the first circuit 51L and the second circuit 51H described above. Therefore, excellent isolation characteristics are provided between a plurality of frequency bands in the CA method.

In addition, two circuits among the second circuit, the third circuit, and the fourth circuit are electromagnetic-field coupled with each other.

In this case, there is a possibility that a transmission signal or a harmonic component that propagates along the signal path 33H may propagate into the reception path (Rx) of the signal path 31H via the high-frequency switch 22H. In such a case, it is possible that the reception sensitivity of a reception signal that propagates along the signal path 31H may be degraded.

However, in the front-end module 1F according to the present preferred embodiment, the second circuit, the third circuit, and the fourth circuit are connected to the signal paths 31H and 33H.

Thus, the amplitude and phase of a signal that propagates between the signal path 31H and the signal path 33H without passing through the high-frequency switch 22H are able to be easily adjusted by adjusting the degree of electromagnetic-field coupling between two circuits from among the second circuit, the third circuit, and the fourth circuit. Therefore, a transmission signal or a harmonic component that propagates from the signal path 33H to the signal path 31H without passing through the high-frequency switch 22H (path D) cancels out a transmission signal or a harmonic component that propagates from the signal path 33H to the signal path 31H via the high-frequency switch 22H (path C).

Thus, not only is a noise component that propagates from the first signal path to the second signal path, which are subjected to a CA operation, able to be reduced or prevented, but a noise component that propagates from the third signal path that is subjected to a CA operation to the second signal path is also able to be reduced or prevented.

Therefore, excellent isolation characteristics are provided between a plurality of frequency bands that are subjected to a CA operation in a system including a switch that supports direct mapping.

In the present preferred embodiment, an example has been described in which the third frequency band belongs to the high-band section 10H, but the third frequency band may instead belong to the low-band section 10L.

Preferred Embodiment 5

In preferred embodiments 1 to 4, front-end modules have been described that perform a CA operation in two frequency band groups including a low-frequency band group (low-band section) and a high-frequency band group (high-band group), whereas in preferred embodiment 5, a front-end module is described in which a CA operation is performed in three frequency band groups including a low-frequency band group (low-band section), a high-frequency band group (high-band group), and a middle frequency band group (middle-band group).

Figure 12:
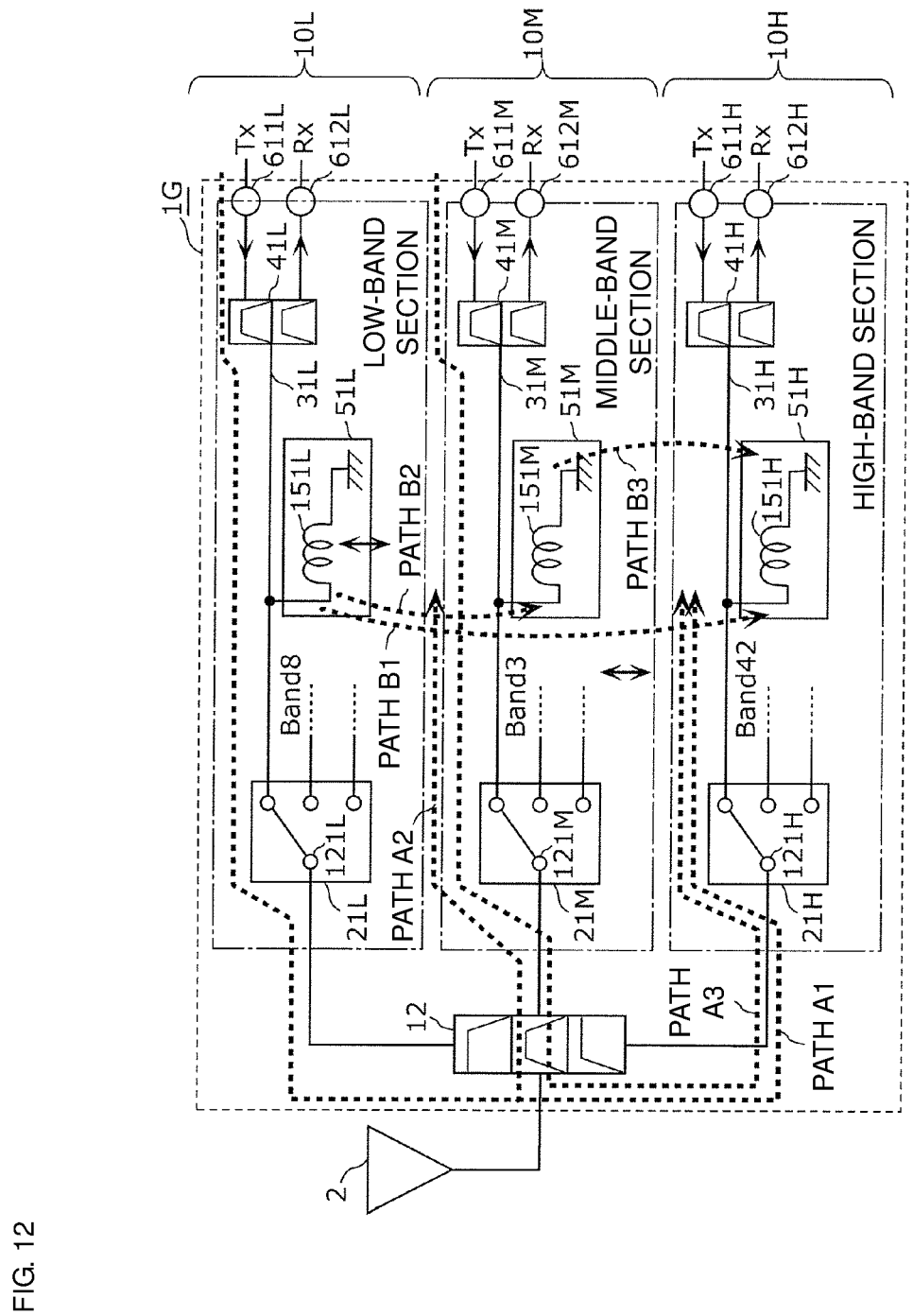
FIG. 12 is a circuit configuration diagram of a front-end module according to preferred embodiment 5 of the present invention.

FIG. 12 is a circuit configuration diagram of a front-end module 1G according to preferred embodiment 5. In FIG. 12, the front-end module 1G according to preferred embodiment 5 and an antenna element 2 are illustrated. The front-end module 1G and the antenna element 2 are preferably arranged in the front end of a cellular phone that supports multiple modes/multiple bands, for example.

The front-end module 1G includes a triplexer 12, the antenna switch module 21, a signal path 31M that is used to propagate signals of Band 3 of the LTE standard (transmission band: 1710-1785 MHz, reception band: 1805-1880 MHz), for example, a signal path 31L that is used to propagate of signals of Band 8 of the LTE standard (transmission band: 880-915 MHz, reception band: 925-960 MHz), for example, a signal path 31H that is used to propagate signals of Band 42 of the LTE standard (transmission/reception band 3400-3600 MHz), for example, a first circuit 51L, a second circuit 51H, a sixth circuit 51M, and duplexers 41H, 41L, and 41M.

The front-end module 1G is a multi-carrier transmission/reception device that is provided with a plurality of signal paths that transmit and receive wireless signals using a plurality of frequency bands in order to support multiple modes/multiple bands. In the present preferred embodiment, Band 3, Band 8, and Band 42 of the 3G/4G LTE standard, for example, are preferably provided as the plurality of frequency bands. Signals in which Band 3, Band 8, and Band 42 are used as carrier waves respectively propagate along the signal paths 31H and 31L using a frequency division duplexing (FDD) method.

The front-end module 1G according to the present preferred embodiment may include signal paths along which signals of other frequency bands propagate, not just those of Band 3, Band 8, and Band 42, and may include signal paths along which signals of frequency bands used in the TDD method propagate, not just those used in the FDD method.

Signal processing using the FDD method is performed along the signal paths 31H, 31L and 31M, and therefore, the duplexers 41H, 41L, and 41M, which are capable of simultaneously transmitting and receiving signals, are respectively arranged along the signal paths 31H, 31L, and 31M. Duplexers do not need to be arranged in the case of signal paths along which signal processing using the TDD method is performed.

The transmission paths (Tx) of the signal paths 31H, 31L, and 31M are respectively connected to a transmission processing circuit (not illustrated), which amplifies transmission waves in advance, via transmission terminals 611H, 611L, and 611M. In addition, reception paths (Rx) of the signal paths 31H, 31L, and 31M are respectively connected to a reception processing circuit (not illustrated) such as a low-noise amplifier, via reception terminals 612H, 612L, and 612M.

Here, in the front-end module 1G according to the present preferred embodiment, a carrier aggregation (CA) method in which different frequency bands are simultaneously used is provided in order to improve communication quality. In other words, communication is performed by simultaneously using as carrier waves a second frequency band selected from among frequency bands belonging to a high-frequency band group (high-band section), a first frequency band selected from among frequency bands belonging to a low-frequency band group (low-band section), and a frequency band selected from among frequency bands belonging to a middle frequency band group (middle-band section). More specifically, in the present preferred embodiment, Band 42 belonging to the high-frequency band group, Band 8 belonging to the low-frequency band group, and Band 3 belonging to the middle frequency band group are simultaneously used.

The triplexer 11 splits a wireless signal input from the antenna element 2 into the low-frequency band group (low-band section 10L: for example, 700 MHz-1 GHz), the middle frequency band group (middle-band section 10M: for example, 1 GHz-3 GHz, 1.5 GHz-2.2 GHz, or 1.5 GHz-2.7 GHz), or the high-frequency band group (high-band section 10H: for example, from 2.3 GHz or from 3 GHz), and outputs the signal to the antenna switch module 21. In addition, the triplexer 12 outputs transmission signals, which are input thereto from the signal paths via the antenna switch module 21, to the antenna element 2.

The antenna switch module 21 switches the connections between the antenna element 2 and the plurality of signal paths by connecting the antenna element 2 and at least two signal paths from among the plurality of signal paths to each other. More specifically, the antenna switch module 21 includes high-frequency switches 21H, 21L, and 21M. The high-frequency switch 21H includes a high-frequency-side input terminal 121H that is connected to the triplexer 12, and a plurality of output terminals that are respectively connected to the plurality of signal paths of the high-band section 10H. The high-frequency-side input terminal 121H is exclusively connected to one signal path out of the signal paths of the high-band section 10H that includes the Band 42 signal path 31H. In addition, the high-frequency switch 21L includes a low-frequency-side input terminal 121L that is connected to the triplexer 12 and a plurality of output terminals that are respectively connected to the plurality of signal paths of the low-band section 10L. The low-frequency-side input terminal 121L is exclusively connected to one signal path out of the signal paths of the low-band section 10L that includes the Band 8 signal path 31L. In addition, the high-frequency switch 21M includes a middle-frequency-side input terminal 121M that is connected to the triplexer 12 and a plurality of output terminals that are respectively connected to the plurality of signal paths of the middle-band section 10M. The middle-frequency-side input terminal 121M is exclusively connected to one signal path out of the signal paths of the middle-band section 10M that includes the Band 3 signal path 31M.

In other words, the antenna switch module 21 includes three single-input multiple-output high-frequency switches corresponding to the high-frequency band group, the low-frequency band group, and the middle-frequency band group, and is able to simultaneously connect the Band 42 signal path 31H of the high-band section 10H, the Band 8 signal path 31L of the low-band section 10L, and the Band 3 signal path 31M of the middle-band section 10M.

The first circuit 51L is connected to the signal path 31L (first signal path) that is used to propagate Band 8 (first frequency band) signals. In addition, the second circuit 51H is connected to the signal path 31H (second signal path) that is used to propagate Band 42 (second frequency band) signals. In addition, the sixth circuit 51M is connected to the signal path 31M that is used to propagate Band 3 signals. Here, at least two circuits among the first circuit 51L, the second circuit 51H, and the sixth circuit are electromagnetic-field coupled with each other.

The first circuit 51L preferably includes an inductor 151L (first inductance element), for example. The two terminals of the inductor 151L are respectively connected to the signal path 31L and a ground terminal.

The second circuit 51H preferably includes an inductor 151H (second inductance element), for example. The two terminals of the inductor 151H are respectively connected to the signal path 31H and a ground terminal.

The sixth circuit 51M preferably includes an inductor 151M, for example. The two terminals of the inductor 151M are respectively connected to the signal path 31M and a ground terminal.

In the present preferred embodiment, the frequency of a second-order harmonic component of a Band 8 (first frequency band) transmission signal (transmission band: 880-915 MHz) is included in the Band 3 (second frequency band) reception band (1805-1880 MHz). In other words, the frequency of a harmonic of the transmission signal of the first frequency band is included in the second frequency band. Because of this frequency relationship, there is a possibility that the second-order harmonic component of the Band 8 transmission signal that propagates along the signal path 31L from the transmission processing circuit may propagate into the reception path (Rx) of the signal path 31M via the antenna switch module and the triplexer 12 (path A2). In this case, there is a possibility of the Band 3 reception sensitivity being degraded in a state in which Band 8 and Band 3 are subjected to a CA operation.

In addition, the frequency of a fourth-order harmonic component of the Band 8 (first frequency band) transmission signal (transmission band: 880-915 MHz) is preferably included in the Band 42 reception band (3400-3600 MHz). Because of this frequency relationship, there is a possibility that the fourth-order harmonic component of the Band 8 transmission signal that propagates along the signal path 31L from the transmission processing circuit may propagate into the reception path (Rx) of the signal path 31H via the antenna switch module and the triplexer 12 (path A1). In this case, there is a possibility of the Band 42 reception sensitivity being degraded in a state in which Band 8 and Band 42 are subjected to a CA operation.

In addition, the frequency of a second-order harmonic component of the transmission signal of Band 3 (transmission band: 1710-1785 MHz MHz) is preferably included in the reception band of Band 42 (3400-3600 MHz). Because of this frequency relationship, there is a possibility that the second-order harmonic component of the Band 3 transmission signal that propagates along the signal path 31M from the transmission processing circuit may propagate into the reception path (Rx) of the signal path 31H via the antenna switch module and the triplexer 12 (path A3). In this case, there is a possibility of the reception sensitivity of Band 42 being degraded in a state in which Band 3 and Band 42 are subjected to a CA operation.

However, the first circuit 51L, the second circuit 51H, and the sixth circuit 51M, which are electromagnetic-field coupled with each other, are respectively connected to the signal paths 31L, 31H, and 31M in the front-end module 1G according to the present preferred embodiment.

Here, the first circuit 51L and the second circuit 51H are structured and function such that a fourth-order harmonic component of the Band 8 transmission signal that propagates from the signal path 31L to the signal path 31H via the first circuit 51L and the second circuit 51H (without passing though the antenna switch module 21) (path B1) cancels out a fourth-order harmonic component that propagates from the signal path 31L to the signal path 31H via the antenna switch module 21 (path A1). More specifically, the inductors 151L and 151H are arranged such that the signal phases of the fourth-order harmonic component that propagates along path A1 and the fourth-order harmonic component that propagates along path B1 are shifted relative to each other. The inductors 151L and 151H are preferably arranged such that the fourth-order harmonic component that propagates along path A1 and the fourth-order harmonic component that propagates along path B1 have identical or substantially identical signal amplitudes and an inverse phase relationship with each other.

In addition, the first circuit 51L and the sixth circuit 51M are structured and function such that a second-order harmonic component of the Band 8 transmission signal that propagates from the signal path 31L to the signal path 31M via the first circuit 51L and the sixth circuit 51M (without passing through the antenna switch module 21) (path B2) cancels out a second-order harmonic component that propagates from the signal path 31L to the signal path 31M via the antenna switch module 21 (path A2). More specifically, the inductors 151L and 151M are arranged such that the signal phases of the second-order harmonic component that propagates along path A2 and the second-order harmonic component that propagates along path B2 are shifted relative to each other. The inductors 151L and 151M are preferably arranged such that the second-order harmonic component that propagates along path A2 and the second-order harmonic component that propagates along path B2 have identical or substantially identical signal amplitudes and an inverse phase relationship with each other.

In addition, the sixth circuit 51M and the second circuit 51H are structured and function such that a second-order harmonic component of the Band 3 transmission signal that propagates from the signal path 31M to the signal path 31H via the sixth circuit 51M and the second circuit 51H (without passing through the antenna switch module 21) (path B3) cancels out a second-order harmonic component that propagates from the signal path 31M to the signal path 31H via the antenna switch module 21 (path A3). More specifically, the inductors 151M and 151H are arranged such that the signal phases of the second-order harmonic component that propagates along path A3 and the second-order harmonic component that propagates along path B3 are shifted relative to each other. The inductors 151M and 151H are preferably arranged such that the second-order harmonic component that propagates along path A3 and the second-order harmonic component that propagates along path B3 have identical or substantially identical signal amplitudes and an inverse phase relationship with each other.

The amplitudes and phases of signals that propagate between the signal path 31L, the signal path 31H, and the signal path 31M without passing through the antenna switch module 21 are able to be easily adjusted by adjusting the degree of electromagnetic-field coupling between the first circuit 51L, the second circuit 51H, and the sixth circuit 51M described above. Therefore, excellent isolation characteristics are provided between a plurality of frequency bands in the CA method.

Front-end modules according to preferred embodiments of the present invention have been described above as preferred embodiments and modifications, but front-end modules of the present invention are not limited to these preferred embodiments and modifications. Other preferred embodiments obtained by combining any of the elements of the above-described preferred embodiments and modifications with one another, modifications obtained by modifying the above-described preferred embodiments and modifications in various ways, as thought of by one skilled in the art, while not departing from the gist of the present invention, and various devices including a front-end module of the present disclosure built thereinto are included in the present invention.

For example, preferably, Band 3 is used as a second frequency band selected from among frequency bands belonging to a high-frequency band group and Band 8 is used as a first frequency band selected from among frequency bands belonging to a low-frequency band group in preferred embodiments 1 to 5 and modifications thereof described above, but a front-end module according to the present invention is not limited to this combination of Band 3 and Band 8. As long as the relationship exists that the frequency of a harmonic of a signal of the first frequency band is included in the second frequency band, any bands may be used for the first frequency band and the second frequency band.

The front-end modules according to preferred embodiments 1 to 5 may further include a phase-adjusting circuit that is connected to the signal path 31L (first signal path), the signal path 31H (second signal path), or the signal path 31M, and that is able to adjust the phase of a high-frequency signal. This phase-adjusting circuit differs from the first to sixth circuits, which are electromagnetic-field coupled with each other, and does not need to be electromagnetic-field coupled with another circuit.

Thus, the phase-adjusting circuit strengthens the high-frequency signal phase-adjusting functions of the first circuit, the second circuit, and the sixth circuit, and therefore, the phases of signals that propagate between the signal paths 31L, 31H, and 31M without passing through the antenna switch module 21 are able to be adjusting with higher accuracy and over a wider range.

In addition, in the front-end modules according to the preferred embodiments and modifications described above, other high-frequency circuit elements, wiring lines and other components may be inserted between paths that connect circuit elements and signal paths disclosed in the drawings.

Preferred embodiments of the present invention may be broadly used in electronic appliances, such as cellular phones, as front-end modules that support multiple bands/multiple modes in which a carrier aggregation method is used.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A front-end module, which uses a carrier aggregation method in which communication is performed by simultaneously using a first frequency band selected from among a plurality of frequency bands and a second frequency band selected from among the plurality of frequency bands and being at a different frequency from the first frequency band, the front-end module comprising:
a plurality of signal paths that connect a transmission processing circuit, which amplifies transmission waves in advance, or a reception processing circuit, which subjects reception waves to signal processing, and an antenna to each other, and that propagate signals of corresponding frequency bands among the plurality of frequency bands;
an antenna switch module that switches connections between the antenna and the plurality of signal paths by simultaneously connecting the antenna and at least two signal paths among the plurality of signal paths;
a first circuit that is connected to a first signal path that propagates signals of the first frequency band; and
a second circuit that is connected to a second signal path that propagates signals of the second frequency band, and is electromagnetic-field coupled with the first circuit; wherein
a signal including a frequency component of the second frequency band that propagates from the first signal path to the second signal path via the antenna switch module, and a signal including a frequency component of the second frequency band that propagates from the first signal path to the second signal path via the first circuit and the second circuit have a phase-shifted relationship with each other.

2. The front-end module according to claim 1, wherein
the first frequency band belongs to a low-frequency band group;
the second frequency band belongs to a high-frequency band group allocated to higher frequencies than the low-frequency band group; and
a frequency of a harmonic of a signal of the first frequency band is included in the second frequency band.

3. The front-end module according to claim 1, wherein
the first circuit includes a first inductor;
the second circuit includes a second inductor that is electromagnetic-field coupled with the first inductor; and
the first inductor and the second inductor are both chip inductors that are mounted on a module substrate that includes the antenna switch module.

4. The front-end module according to claim 1, wherein
the first circuit includes a first inductor;
the second circuit includes a second inductor that is electromagnetic-field coupled with the first inductor;
one of the first inductor and the second inductor is a chip inductor that is mounted on a module substrate that includes the antenna switch module; and
another one of the first inductor and the second inductor is built into the module substrate.

5. The front-end module according to claim 1, wherein
the first circuit includes a first inductor;
the second circuit includes a second inductor that is electromagnetic-field coupled with the first inductor; and
the first inductor and the second inductor are both built into a module substrate that includes the antenna switch module.

6. The front-end module according to claim 1, further comprising a phase-adjusting circuit that is connected to the first signal path or the second signal path and that adjusts a phase of a high-frequency signal.

7. The front-end module according to claim 1, wherein one of the first circuit and the second circuit includes an inductor, and another one of the first circuit and the second circuit includes a wiring line that is electromagnetic-field coupled with the inductor.

8. The front-end module according to claim 1, wherein
the front-end module performs communication by simultaneously using the first frequency band and the second frequency band from among the first frequency band, the second frequency band, and a third frequency band selected from among the plurality of frequency bands and being at a different frequency from the first frequency band and the second frequency band;
a third signal path that propagates signals of the third frequency band branches, at a branching node, into a fourth signal path and a fifth signal path that propagate signals of the third frequency band;
the front-end module further includes:
a third circuit that is connected upstream of the branching node of the third signal path;
a fourth circuit that is connected to the fourth signal path; and
a fifth circuit that is connected to the fifth signal path; wherein
two circuits from among the third circuit, the fourth circuit, and the fifth circuit are electromagnetic-field coupled with each other; and
a signal including a frequency component of a fifth frequency band that propagates from the fourth signal path to the fifth signal path via the branching node, and a signal including a frequency component of the fifth frequency band that propagates from the fourth signal path to the fifth signal path via the two circuits have a phase-shifted relationship with each other.

9. The front-end module according to claim 8, wherein
the first frequency band belongs to a low-frequency band group;
the second frequency band belongs to a high-frequency band group allocated to higher frequencies than the low-frequency band group; and
a frequency of a harmonic of a signal of the first frequency band is included in the second frequency band.

10. The front-end module according to claim 8, wherein
the first circuit includes a first inductor;
the second circuit includes a second inductor that is electromagnetic-field coupled with the first inductor; and
the first inductor and the second inductor are both chip inductors that are mounted on a module substrate that includes the antenna switch module.

11. The front-end module according to claim 8, wherein
the first circuit includes a first inductor;
the second circuit includes a second inductor that is electromagnetic-field coupled with the first inductor;
one of the first inductor and the second inductor is a chip inductor that is mounted on a module substrate that includes the antenna switch module; and
another one of the first inductor and the second inductor is built into the module substrate.

12. The front-end module according to claim 8, wherein
the first circuit includes a first inductor;
the second circuit includes a second inductor that is electromagnetic-field coupled with the first inductor; and
the first inductor and the second inductor are both built into a module substrate that includes the antenna switch module.

13. The front-end module according to claim 8, further comprising a phase-adjusting circuit that is connected to the first signal path or the second signal path and that adjusts a phase of a high-frequency signal.

14. The front-end module according to claim 8, wherein one of the first circuit and the second circuit includes an inductor, and another one of the first circuit and the second circuit includes a wiring line that is electromagnetic-field coupled with the inductor.

15. The front-end module according to claim 1, wherein the front-end module performs communication by simultaneously using the first frequency band and the second frequency band, and a third frequency band selected from among the plurality of frequency bands and being at a different frequency from the first frequency band and the second frequency band;
the antenna switch module switches connections between the antenna and the plurality of signal paths by simultaneously connecting the antenna and three signal paths from among the plurality of signal paths;
the front-end module further includes:
a third circuit that is connected to a third signal path that propagates signals of the third frequency band; and
a fourth circuit that is downstream of a connection point between the first signal path and the first circuit or downstream of a connection point between the second signal path and the second circuit;
two circuits from among the first circuit or the second circuit, and the third circuit, and the fourth circuit are electromagnetic-field coupled with each other; and
a signal including a frequency component of the second frequency band that propagates from the third signal path to the second signal path via the antenna switch module, and a signal including a frequency component of the second frequency band that propagates from the third signal path to the second signal path via the two circuits have a phase-shifted relationship with each other.

16. The front-end module according to claim 15, wherein the first frequency band belongs to a low-frequency band group;
the second frequency band belongs to a high-frequency band group allocated to higher frequencies than the low-frequency band group; and
a frequency of a harmonic of a signal of the first frequency band is included in the second frequency band.

17. The front-end module according to claim 15, wherein the first circuit includes a first inductor;
the second circuit includes a second inductor that is electromagnetic-field coupled with the first inductor; and
the first inductor and the second inductor are both chip inductors that are mounted on a module substrate that includes the antenna switch module.

18. The front-end module according to claim 15, wherein the first circuit includes a first inductor;
the second circuit includes a second inductor that is electromagnetic-field coupled with the first inductor;
one of the first inductor and the second inductor is a chip inductor that is mounted on a module substrate that includes the antenna switch module; and
another one of the first inductor and the second inductor is built into the module substrate.

19. The front-end module according to claim 15, wherein the first circuit includes a first inductor;
the second circuit includes a second inductor that is electromagnetic-field coupled with the first inductor; and
the first inductor and the second inductor are both built into a module substrate that includes the antenna switch module.

20. The front-end module according to claim 15, further comprising a phase-adjusting circuit that is connected to the first signal path or the second signal path and that adjusts a phase of a high-frequency signal.

* * * * *